(12) United States Patent
Cottuli

(10) Patent No.: US 11,092,652 B2
(45) Date of Patent: Aug. 17, 2021

(54) GRID ISLANDED FUEL CELL INSTALLATION FOR DATA CENTER LOAD

(71) Applicant: BLOOM ENERGY CORPORATION, Sunnyvale, CA (US)

(72) Inventor: Carl Cottuli, Franklin, MA (US)

(73) Assignee: BLOOM ENERGY CORPORATION, San Jose, CA (US)

(*) Notice: Subject to any disclaimer, the term of this patent is extended or adjusted under 35 U.S.C. 154(b) by 304 days.

(21) Appl. No.: 16/238,336

(22) Filed: Jan. 2, 2019

(65) Prior Publication Data
US 2019/0204391 A1    Jul. 4, 2019

Related U.S. Application Data

(60) Provisional application No. 62/613,222, filed on Jan. 3, 2018.

(51) Int. Cl.
     *G01R 31/374*    (2019.01)
     *H01M 8/04701*    (2016.01)
     (Continued)

(52) U.S. Cl.
     CPC ........... *G01R 31/374* (2019.01); *G01R 31/38* (2019.01); *G01R 31/3828* (2019.01);
     (Continued)

(58) Field of Classification Search
     CPC ............. H01M 8/0494; H01M 8/0497; H01M 8/04626; H01M 8/0432; H01M 8/04365;
     (Continued)

(56) References Cited

U.S. PATENT DOCUMENTS

| | | | |
|---|---|---|---|
| 8,263,276 B1 * | 9/2012 | Gurunathan | ............ H02J 1/102 429/429 |
| 8,970,176 B2 | 3/2015 | Ballantine et al. | |

(Continued)

OTHER PUBLICATIONS

U.S. Appl. No. 15/455,307, filed Mar. 10, 2017, Bloom Energy Corporation.

(Continued)

*Primary Examiner* — Huy Q Phan
*Assistant Examiner* — Dustin R Dickinson
(74) *Attorney, Agent, or Firm* — The Marbury Law Group PLLC

(57) ABSTRACT

Various embodiments manage a fuel cell IT grid system to maintain fuel cell temperatures above a threshold temperature. The system may include power modules each including a fuel cell, DC/DC converters each connected to a power module, a DC power bus connected to the DC/DC, IT loads each connected to the DC power bus, a load balancing load connected to the DC power bus, and a control device connected to a first power module. The control device may determine whether a temperature of the first power module exceeds the temperature threshold, determine whether an electrical power output of the power modules exceeds an electrical power demand of the IT loads in response to the temperature exceeding the temperature threshold, and direct excess electrical power output to the load balancing load in response to the electrical power output exceeding the electrical power demand.

4 Claims, 15 Drawing Sheets

(51) Int. Cl.
  *G01R 31/378* (2019.01)
  *H01M 8/0432* (2016.01)
  *G01R 31/3828* (2019.01)
  *H01M 8/04828* (2016.01)
  *H01M 8/04537* (2016.01)

(52) U.S. Cl.
  CPC ....... *H01M 8/0432* (2013.01); *H01M 8/0494* (2013.01); *H01M 8/04365* (2013.01); *H01M 8/04619* (2013.01); *H01M 8/04626* (2013.01); *H01M 8/04701* (2013.01); *H01M 8/04731* (2013.01); *H01M 8/04947* (2013.01)

(58) Field of Classification Search
  CPC .......... H01M 8/04701; H01M 8/04731; G01R 31/374; G01R 31/38; G01R 31/3828; G01R 19/2513; H02J 3/381; H02J 3/388; H02J 2300/30; Y02E 60/50; Y02B 90/10
  See application file for complete search history.

(56) References Cited

U.S. PATENT DOCUMENTS

| | | | |
|---|---|---|---|
| 9,106,098 B2 | 8/2015 | Srinivasan et al. | |
| 9,214,812 B2 | 12/2015 | Ballantine et al. | |
| 9,362,815 B2 | 6/2016 | Gurunathan et al. | |
| 9,461,320 B2 | 10/2016 | Ballantine et al. | |
| 9,639,130 B2 | 5/2017 | Gurunathan et al. | |
| 9,698,598 B2 | 7/2017 | Ballantine et al. | |
| 9,972,852 B2 | 5/2018 | Ballantine et al. | |
| 2003/0111908 A1* | 6/2003 | Christensen | H02J 1/10 307/43 |
| 2012/0098336 A1 | 4/2012 | Gurunathan et al. | |
| 2012/0146587 A1 | 6/2012 | Srinivasan et al. | |
| 2012/0267952 A1 | 10/2012 | Ballantine et al. | |
| 2012/0326504 A1 | 12/2012 | Ballantine et al. | |
| 2012/0326668 A1 | 12/2012 | Ballantine et al. | |
| 2014/0009003 A1 | 1/2014 | Ballantine et al. | |
| 2015/0228990 A1 | 8/2015 | Ballantine et al. | |
| 2015/0288220 A1 | 10/2015 | Gurunathan et al. | |
| 2017/0005480 A1 | 1/2017 | Ballantine et al. | |
| 2017/0070088 A1* | 3/2017 | Berntsen | H02J 1/00 |
| 2017/0077535 A1 | 3/2017 | Sudhan et al. | |
| 2017/0271875 A1* | 9/2017 | Narla | H02J 3/381 |
| 2017/0338502 A1 | 11/2017 | Pmsvvsv et al. | |
| 2018/0052431 A1* | 2/2018 | Shaikh | G06F 1/32 |
| 2018/0337554 A1* | 11/2018 | Thomas | H02J 3/46 |

OTHER PUBLICATIONS

U.S. Appl. No. 15/945,159, filed Apr. 4, 2018, Bloom Energy Corporation.

U.S. Appl. No. 15/945,194, filed Apr. 4, 2018, Bloom Energy Corporation.

\* cited by examiner

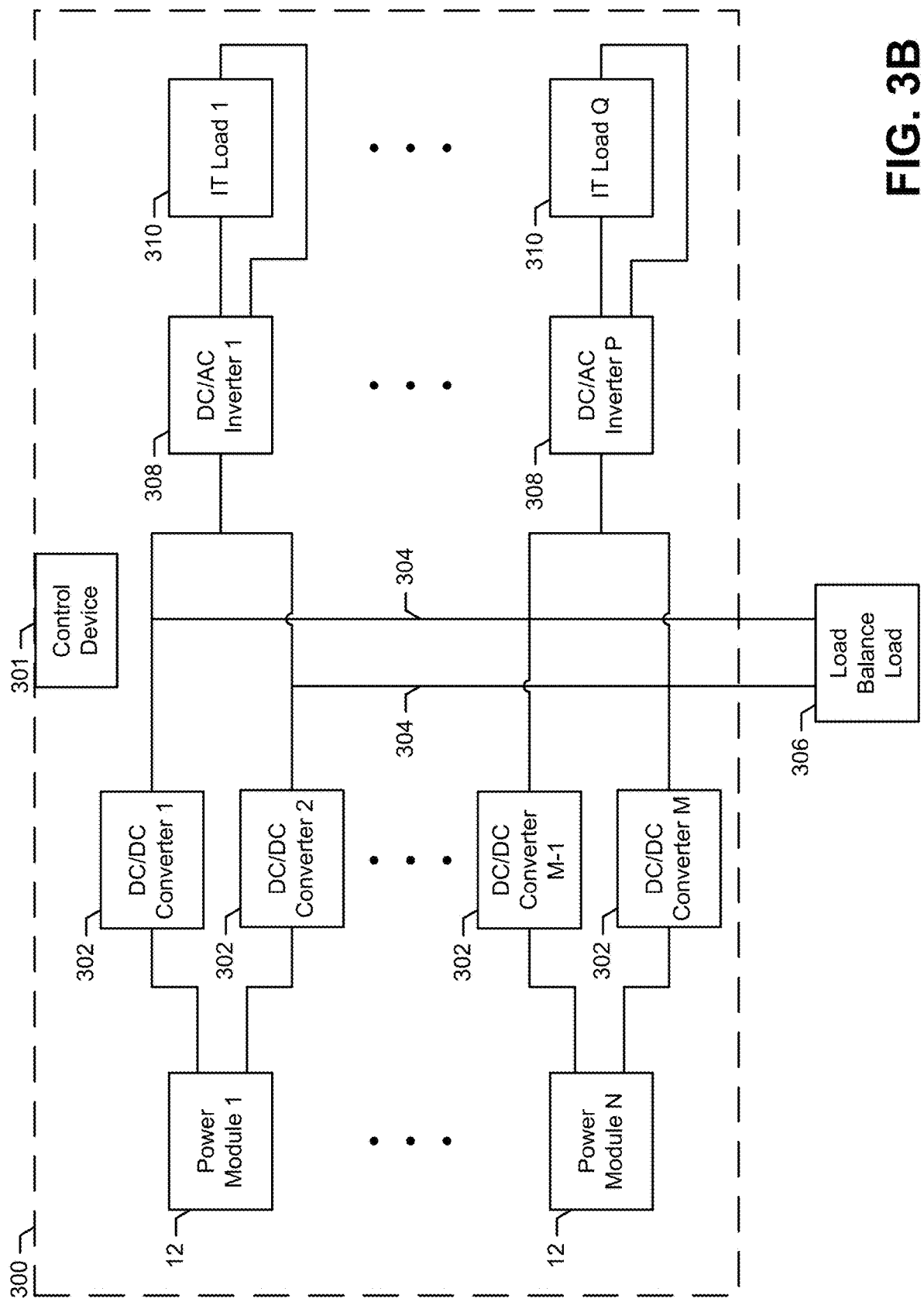

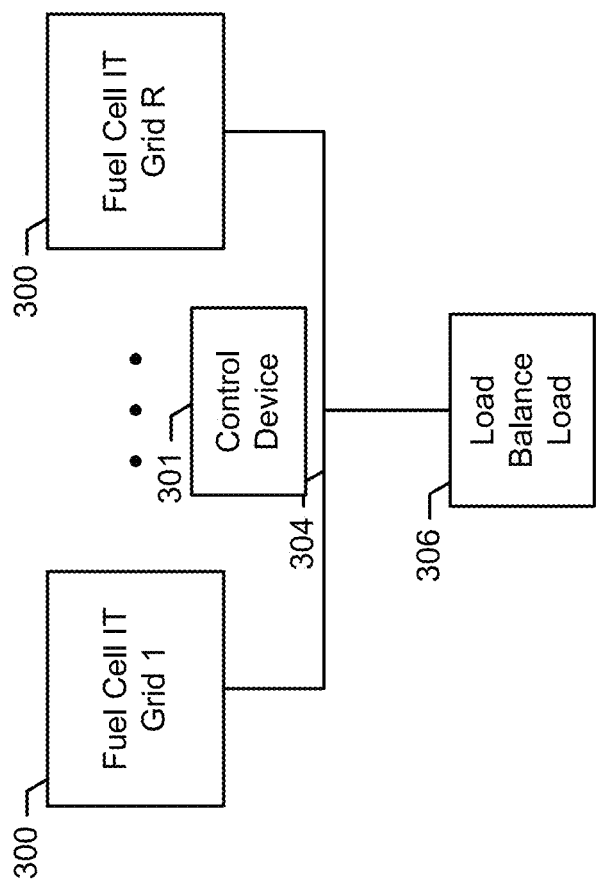

GRID ISLANDED FUEL CELL INSTALLATION FOR DATA CENTER LOAD

FIELD

The present invention is generally directed to power generation systems and, in particular, to a fuel cell system that efficiently manages fuel cell power output that exceeds a load power demand.

BACKGROUND

Electrochemical devices, such as fuel cells, can convert energy stored in fuels to electrical energy with high efficiencies. In a fuel cell system, such as a solid oxide fuel cell (SOFC) system, an oxidizing flow is passed through the cathode side of the fuel cell while a fuel inlet flow is passed through the anode side of the fuel cell. The oxidizing flow is typically air, while the fuel flow can be a hydrocarbon fuel, such as methane, natural gas, pentane, ethanol, or methanol. The fuel cell enables the transport of negatively charged oxygen ions from the cathode flow stream to the anode flow stream, where the ion combines with either free hydrogen or hydrogen in a hydrocarbon molecule to form water vapor and/or with carbon monoxide to form carbon dioxide. The excess electrons from the negatively charged ion are routed back to the cathode side of the fuel cell through an electrical circuit completed between anode and cathode, resulting in an electrical current flow through the circuit.

SOFC systems may be used to power many different devices under many different arrangements. The variety of potential applications creates a need for an SOFC system and control method that can be readily adapted for use with different kinds of systems using different control hardware and software.

SUMMARY

The systems, methods, and devices of the various embodiments enable the management of a fuel cell grid system. Various embodiments may include a plurality of power modules each including at least one fuel cell, a plurality of direct current (DC)/DC converters each electrically connected to a power module of the plurality of power modules, a DC power bus electrically connected to the plurality of DC/DC converters in parallel, a plurality of information technology (IT) loads electrically connected to the DC power bus in parallel, a load balancing load electrically connected to the DC power bus, and a control device communicatively connected to a first power module of the plurality of power modules. In various embodiments, the control device may be configured to determine whether a temperature of the first power module exceeds a temperature threshold of the first power module, determine whether an electrical power output of the plurality of power modules exceeds an electrical power demand of the plurality of IT loads in response to determining that the temperature of the first power module exceeds the temperature threshold of the first power module, and direct excess electrical power output to the load balancing load in response to determining that the electrical power output of the plurality of power modules exceeds the electrical power demand of the plurality of IT loads.

In various embodiments, the control device may be further configured to receive an electrical power demand signal, and determine whether an electrical power output of the plurality of power modules exceeds an electrical power demand of the plurality of IT loads by determining whether the electrical power output of the plurality of power modules exceeds the electrical power demand of the plurality of IT loads in response to receiving the electrical power demand signal.

In various embodiments, the control device may be further configured to increase an electrical power output of the first power module in response to determining that the temperature of the first power module does not exceed the temperature threshold of the first power module.

Various embodiments may further include an electrical connection component configured to electrically connect and disconnect the load balancing load to the DC power bus. In various embodiments, the control device may be further configured to direct excess electrical power output to the load balancing load by controlling the electrical connection component to electrically connect the load balancing load to the DC power bus.

In various embodiments, the electrical connection component may include a bidirectional DC/alternating current (AC) inverter and the load balancing load may include an electrical utility grid.

In various embodiments, the control device may be further configured to determine whether the electrical power demand of the plurality of IT loads exceeds the electrical power output of the plurality of power modules in response to determining that the temperature of the first power module does not exceed the temperature threshold of the first power module, and increase an electrical power output of the first power module in response to determining that the electrical power demand of the plurality of IT loads exceeds the electrical power output of the plurality of power modules.

Various embodiments may include a plurality of power storage devices electrically connected to the DC power bus in parallel and each electrically connected to a power module. In various embodiments, a first power storage device of the plurality of power storage devices is communicatively connected to the control device. In various embodiments, the control device may be further configured to determine whether the electrical power demand of the plurality of IT loads exceeds the electrical power output of the plurality of power modules in response to determining that the temperature of the first power module does not exceed the temperature threshold of the first power module, and control the first power storage device to output electrical power in response to determining that the electrical power demand of the plurality of IT loads exceeds the electrical power output of the plurality of power modules.

Various embodiments may further include a bidirectional DC/AC inverter configured to electrically connect and disconnect the load balancing load to the DC power bus. In various embodiments, the load balancing load may include an electrical utility grid. In various embodiments, the control device may be further configured to determine whether the electrical power demand of the plurality of IT loads exceeds the electrical power output of the plurality of power modules in response to determining that the temperature of the first power module does not exceed the temperature threshold of the first power module, and control the bidirectional DC/AC inverter to electrically connect the electrical utility grid to the DC power bus and supply electrical power to the DC power bus from the electrical utility grid in response to determining that the electrical power demand of the plurality of IT loads exceeds the electrical power output of the plurality of power modules.

Various embodiments may further include a first DC/DC converter and a second DC/DC converter of the plurality of DC/DC converters. In various embodiments, the first DC/DC converter is electrically connected to a first output of the first power module and the second DC/DC converter is electrically connected to a second output of the first power module.

In various embodiments, the DC power bus may include a first DC power bus and a second DC power bus, and the first DC power bus is electrically connected to the first DC/DC converter and the second DC power bus is electrically connected to the second DC/DC converter.

Various embodiments may further include a plurality of DC/AC inverters electrically connected to the DC power bus in parallel and each electrically connected to an IT load of the plurality of IT loads.

Various embodiments may further include a dual corded electrical connection between a first DC/AC inverter of the plurality of DC/AC inverters and a first IT load of the plurality of IT loads.

Various embodiments may further include a first IT load of the plurality of IT loads, and a first DC/AC inverter and a second DC/AC inverter of the plurality of DC/AC inverters. In various embodiments, the first DC/AC inverter is electrically connected to a first input of the first IT load and the second DC/DC converter is electrically connected to a second input of the first IT load.

In various embodiments, the DC power bus may include a first DC power bus and a second DC power bus, and the first DC power bus is electrically connected to the first DC/AC inverter and the second DC power bus is electrically connected to the second DC/AC inverter.

Various embodiments may further include a plurality of fuel cell IT grid systems. In various embodiments, a first fuel cell IT grid system may include a first plurality of power modules of the plurality of power modules, a first plurality of DC/DC converters of the plurality of plurality of DC/DC converters, a first DC power bus, a first plurality of DC/AC inverters of the plurality of DC/AC inverters, and a first plurality of IT loads of the plurality of IT loads, a second fuel cell IT grid system may include a second plurality of power modules of the plurality of power modules, a second plurality of DC/DC converters of the plurality of plurality of DC/DC converters, a second DC power bus, a second plurality of DC/AC inverters of the plurality of DC/AC inverters, and a second plurality of IT loads of the plurality of IT loads, and the DC power bus electrically connects the first fuel cell IT grid system and the second fuel cell IT grid system to the load balancing load.

Various embodiments may further include a plurality of electrical protection components electrically connected in parallel to the DC power bus and each electrically connected to a power module, and configured to electrically connect and disconnect the power module from the DC power bus.

Various embodiments may further include a plurality of electrical protection components electrically connected to the DC power bus in parallel and each electrically connected to an IT load and configured to electrically connect and disconnect the IT load from the DC power bus.

Various embodiments may include an electrical protection component electrically connected to the DC power bus and the load balancing load and configured to electrically connect and disconnect the load balancing load from the DC power bus.

In various embodiments, the load balancing load may include a first load balancing load and a second load balancing load.

In various embodiments, the DC power bus may include a first DC power bus and a second DC power bus. In various embodiments, the first load balancing load is electrically connected to the first DC power bus and the second load balancing load is electrically connected to the second DC power bus.

In various embodiments, the load balancing load may include one or more of a load bank, a cooling load, a mechanical load, an electrical utility grid, or a utility grid.

Various embodiments may include determining whether a temperature of a first power module of a plurality of power modules each including at least one fuel cell exceeds a temperature threshold of the first power module, determining whether an electrical power output of the plurality of power modules exceeds an electrical power demand of a plurality of IT loads in response to determining that the temperature of the first power module exceeds the temperature threshold of the first power module, and directing excess electrical power output to a load balancing load in response to determining that the electrical power output of the plurality of power modules exceeds the electrical power demand of the plurality of IT loads.

Various embodiments may include receiving an electrical power demand signal. In various embodiments, determining whether an electrical power output of a plurality of power modules exceeds an electrical power demand of a plurality of IT loads may include determining whether the electrical power output of the plurality of power modules exceeds the electrical power demand of the plurality of IT loads in response to receiving the electrical power demand signal.

Various embodiments may include increasing an electrical power output of the first power module in response to determining that the temperature of the first power module does not exceed the temperature threshold of the first power module.

In various embodiments, directing excess electrical power output to the load balancing load may include controlling and electrical connection component configured to electrically connect and disconnect the load balancing load from a DC power bus to electrically connect the load balancing load to the DC power bus.

Various embodiments may include determining whether the electrical power demand of the plurality of IT loads exceeds the electrical power output of the plurality of power modules in response to determining that the temperature of the first power module does not exceed the temperature threshold of the first power module, and increasing an electrical power output of the first power module in response to determining that the electrical power demand of the plurality of IT loads exceeds the electrical power output of the plurality of power modules.

Various embodiments may include determining whether the electrical power demand of the plurality of IT loads exceeds the electrical power output of the plurality of power modules in response to determining that the temperature of the first power module does not exceed the temperature threshold of the first power module, and controlling a first power storage device to output electrical power in response to determining that the electrical power demand of the plurality of IT loads exceeds the electrical power output of the plurality of power modules.

In various embodiments, the load balancing load is an electrical utility grid. Various embodiments may include determining whether the electrical power demand of the plurality of IT loads exceeds the electrical power output of the plurality of power modules in response to determining that the temperature of the first power module does not exceed the temperature threshold of the first power module, and controlling a bidirectional DC/AC inverter configured to electrically connect the electrical utility grid to a DC power bus to supply electrical power to the DC power bus from the electrical utility grid in response to determining that the electrical power demand of the plurality of IT loads exceeds the electrical power output of the plurality of power modules.

Various embodiments may include a plurality of power modules each including at least one fuel cell, a plurality of direct current (DC)/DC converters each electrically connected to a power module of the plurality of power modules, a DC power bus electrically connected to the plurality of DC/DC converters in parallel, a plurality of loads electrically connected to the DC power bus in parallel, a load balancing load electrically connected to the DC power bus, and a control device communicatively connected to a first power module of the plurality of power modules. In various embodiments, the control device may be configured to determine whether a temperature of the first power module exceeds a temperature threshold of the first power module, determine whether an electrical power output of the plurality of power modules exceeds an electrical power demand of the plurality of loads in response to determining that the temperature of the first power module exceeds the temperature threshold of the first power module, and direct excess electrical power output to the load balancing load in response to determining that the electrical power output of the plurality of power modules exceeds the electrical power demand of the plurality of loads.

DESCRIPTION OF THE DRAWINGS

FIG. 3B is a block diagram of a fuel cell IT grid system according to some embodiments.

FIG. 3E is a block diagram of a plurality of fuel cell IT grid systems according to some embodiments.

DETAILED DESCRIPTION

Figure 1:
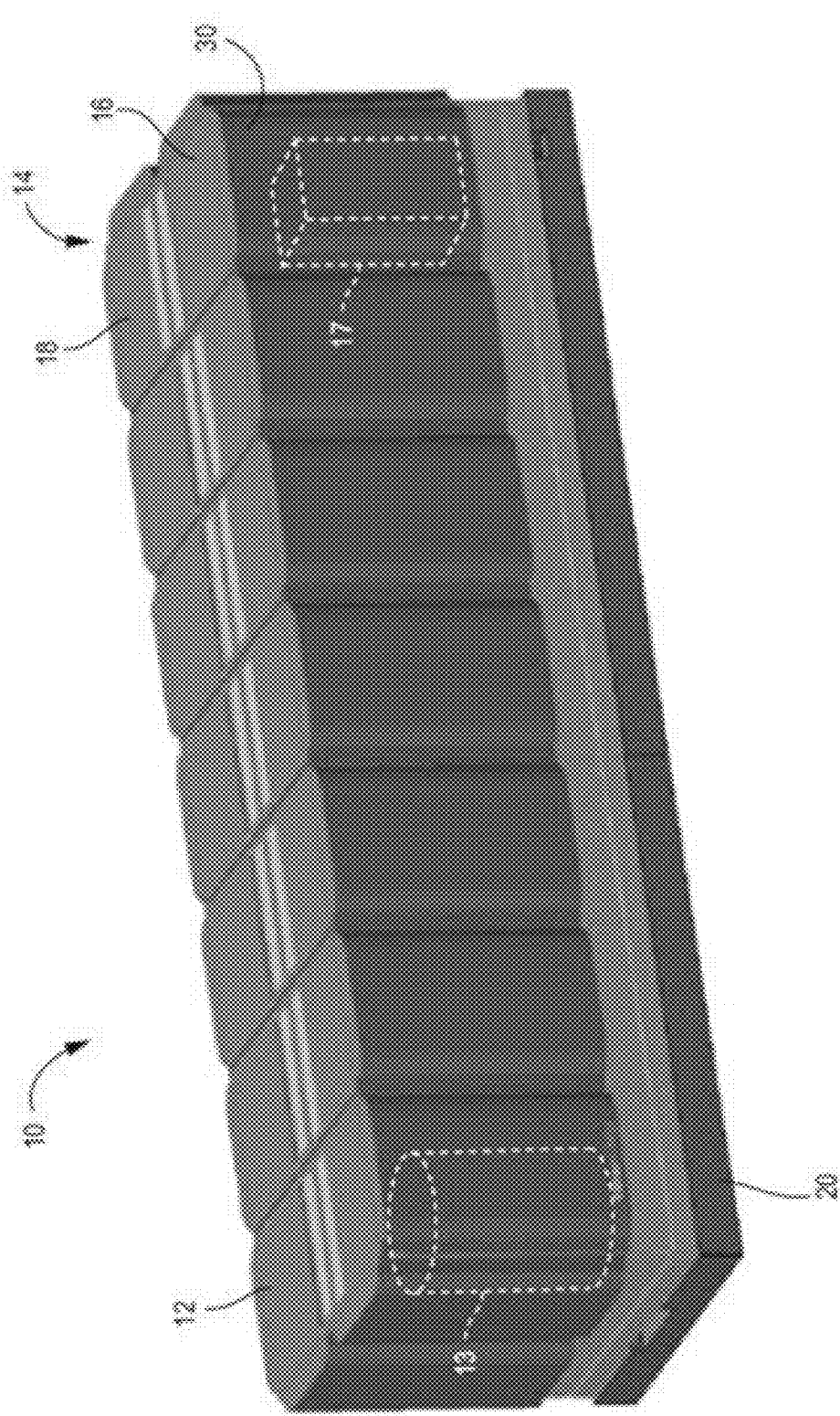
FIG. 1 is a perspective view of a fuel cell system according to various embodiments.

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the claims.

Various embodiments include electrical circuits, electrical components, and methods for managing the cycling of fuel cells in a fuel cell grid system. Fuel cell performance and longevity may be managed and improved by maintaining fuel cell operation at certain outputs, thereby reducing the amount and frequency of heat cycling fuel cells. Temperature of a fuel cell may be correlated to an amount of electrical output generated by the fuel cell. A temperature threshold may be set at a temperature at which fatigue or damage to components of the fuel cell may occur from thermal cycling from below to above the temperature threshold. Repeatedly reheating the fuel cell from temperatures below the temperature threshold to temperatures above the temperature threshold when generating electrical output may compound the fatigue or damage to components of the fuel cell.

Operating a fuel cell at a steady electrical output may maintain the temperature of the fuel cell above the temperature threshold and thus reduce the amount and frequency of thermal cycling below the temperature threshold. However, the electrical power demand by a load varies, and thus when the fuel cell is deployed in a fuel cell grid system the electrical output generated by the fuel cell may drop below the level required to maintain the fuel cell temperature at or above the temperature threshold. Thus, operating a fuel cell in a grid system may generate more electrical power than can be consumed by the system. While storing excess power in batteries is an option, such batteries may be an expensive complication to the system and may be unable to store all of the excess power during some periods.

In various embodiments a load may be any electrical device that consumes electrical power to operate. Loads may include electrical devices for residential, office, industrial, and/or service applications, including electrical devices for lighting, environmental control, machinery, data processing and storage, etc. In the instant application information technology (IT) applications are used as an illustrative example, and do not limit the claims and descriptions to IT application. The term "IT load" as used herein as an illustrative example may be substituted for any type of load in various embodiments. The term "fuel cell IT grid system" may refer to an example full cell grid system incorporating the example IT load, and may be substituted for any fuel cell gird system incorporating any type of load.

Various embodiments may include a load balancing load that is electrically connected to the fuel cell grid system with connections to the load regulated to accept excess power to enable fuel cells to operate at sufficient power to remain above the threshold temperature. The fuel cell grid system may direct to the load balancing load any electrical power generated by the fuel cell in excess of the electrical power demanded by the load and/or a storage capacity in the fuel cell grid system. In various embodiments, the load balancing load may include any electricity consuming or storing device or system. For example, the load balancing load may include a load bank load located within or near the fuel cell grid system configured to dissipate the excess power. As another example, the load balancing load may include a mechanical load located within or near the fuel cell grid system, such as a cooling system. As another example, the load balancing load may include an electrical load of the fuel cell grid system, such as a lighting system. As another example, the load balancing load may include an electrical storage unit located within or near the fuel cell grid system. As another example, the load balancing load may include an electrical load located remotely from the fuel cell grid system, such as an electrical utility grid. In various embodiments, the load balancing load may include multiple of the same type of load balancing load or any combination of various types of load balancing loads.

FIG. 1 illustrates an example of modular fuel cell system that is more fully described in U.S. Pat. No. 8,440,362, incorporated herein by reference for descriptions of the modular fuel cell system. The modular system may contain modules and components described above as well as in U.S. Patent Publication No. US 2011-0281185 (application Ser. No. 11/656,006, filed on Jan. 22, 2007), which is incorporated herein by reference for descriptions of the modular fuel cell system. The modular design of the fuel cell system enclosure 10 provides flexible system installation and operation.

The modular fuel cell system enclosure 10 includes a plurality of power module housings 12 (containing a fuel cell power module components), one or more fuel input (i.e., fuel processing) module housings 16, and one or more power conditioning (i.e., electrical output) module housings 18. For example, the system enclosure may include any desired number of modules, such as 2-30 power modules, for example 6-12 power modules. FIG. 1 illustrates a system enclosure 10 containing six power modules (one row of six modules stacked side to side), one fuel processing module, and one power conditioning module, on a common base 20. Each module may comprise its own cabinet or housing. Alternatively, the power conditioning and fuel processing modules may be combined into a single input/output module located in one cabinet or housing 14. For brevity, each housing 12, 14, 16, 18 will be referred to as "module" below.

While one row of power modules 12 is shown, the system may comprise more than one row of modules 12. For example, the system may comprise two rows of power modules stacked back to back.

Each power module 12 is configured to house one or more hot boxes 13. Each hot box contains one or more stacks or columns of fuel cells (not shown for clarity), such as one or more stacks or columns of solid oxide fuel cells having a ceramic oxide electrolyte separated by conductive interconnect plates. Other fuel cell types, such as PEM, molten carbonate, phosphoric acid, etc. may also be used.

The modular fuel cell system enclosure 10 also contains one or more input or fuel processing modules 16. This module 16 includes a cabinet which contains the components used for pre-processing of fuel, such as desulfurizer beds. The fuel processing modules 16 may be designed to process different types of fuel. For example, a diesel fuel processing module, a natural gas fuel processing module, and an ethanol fuel processing module may be provided in the same or in separate cabinets. A different bed composition tailored for a particular fuel may be provided in each module. The processing module(s) 16 may processes at least one of the following fuels selected from natural gas provided from a pipeline, compressed natural gas, methane, propane, liquid petroleum gas, gasoline, diesel, home heating oil, kerosene, JP-5, JP-8, aviation fuel, hydrogen, ammonia, ethanol, methanol, syn-gas, bio-gas, bio-diesel and other suitable hydrocarbon or hydrogen containing fuels. If desired, a reformer 17 may be located in the fuel processing module 16. Alternatively, if it is desirable to thermally integrate the reformer 17 with the fuel cell stack(s), then a separate reformer 17 may be located in each hot box 13 in a respective power module 12. Furthermore, if internally reforming fuel cells are used, then an external reformer 17 may be omitted entirely.

The modular fuel cell system enclosure 10 also contains one or more power conditioning modules 18. The power conditioning module 18 includes a cabinet which contains the components for converting the fuel cell stack generated DC power to AC power, electrical connectors for AC power output to the grid, circuits for managing electrical transients, a system controller (e.g., a computer or dedicated control logic device or circuit). The power conditioning module 18 may be designed to convert DC power from the fuel cell modules to different AC voltages and frequencies. Designs for 208V, 60 Hz; 480V, 60 Hz; 415V, 50 Hz and other common voltages and frequencies may be provided.

The fuel processing module 16 and the power conditioning module 18 may be housed in one input/output cabinet 14. If a single input/output cabinet 14 is provided, then modules 16 and 18 may be located vertically (e.g., power conditioning module 18 components above the fuel processing module 16 desulfurizer canisters/beds) or side by side in the cabinet 14.

As shown in an example embodiment in FIG. 1, one input/output cabinet 14 is provided for one row of six power modules 12, which are arranged linearly side to side on one side of the input/output module 14. The row of modules may be positioned, for example, adjacent to a building for which the system provides power (e.g., with the backs of the cabinets of the modules facing the building wall). While one row of power modules 12 is shown, the system may include more than one row of modules 12. For example, as noted above, the system may include two rows of power modules stacked back to back.

Each of the power modules 12 and input/output modules 14 include a door 30 (e.g., hatch, access panel, etc.) to allow the internal components of the module to be accessed (e.g., for maintenance, repair, replacement, etc.). According to one embodiment, the modules 12 and 14 are arranged in a linear array that has doors 30 only on one face of each cabinet, allowing a continuous row of systems to be installed abutted against each other at the ends. In this way, the size and capacity of the fuel cell enclosure 10 can be adjusted with additional modules 12 or 14 and bases 20 with minimal rearranging needed for existing modules 12 and 14 and bases 20. If desired, the door 30 to module 14 may be on the side rather than on the front of the cabinet.

Figure 2:
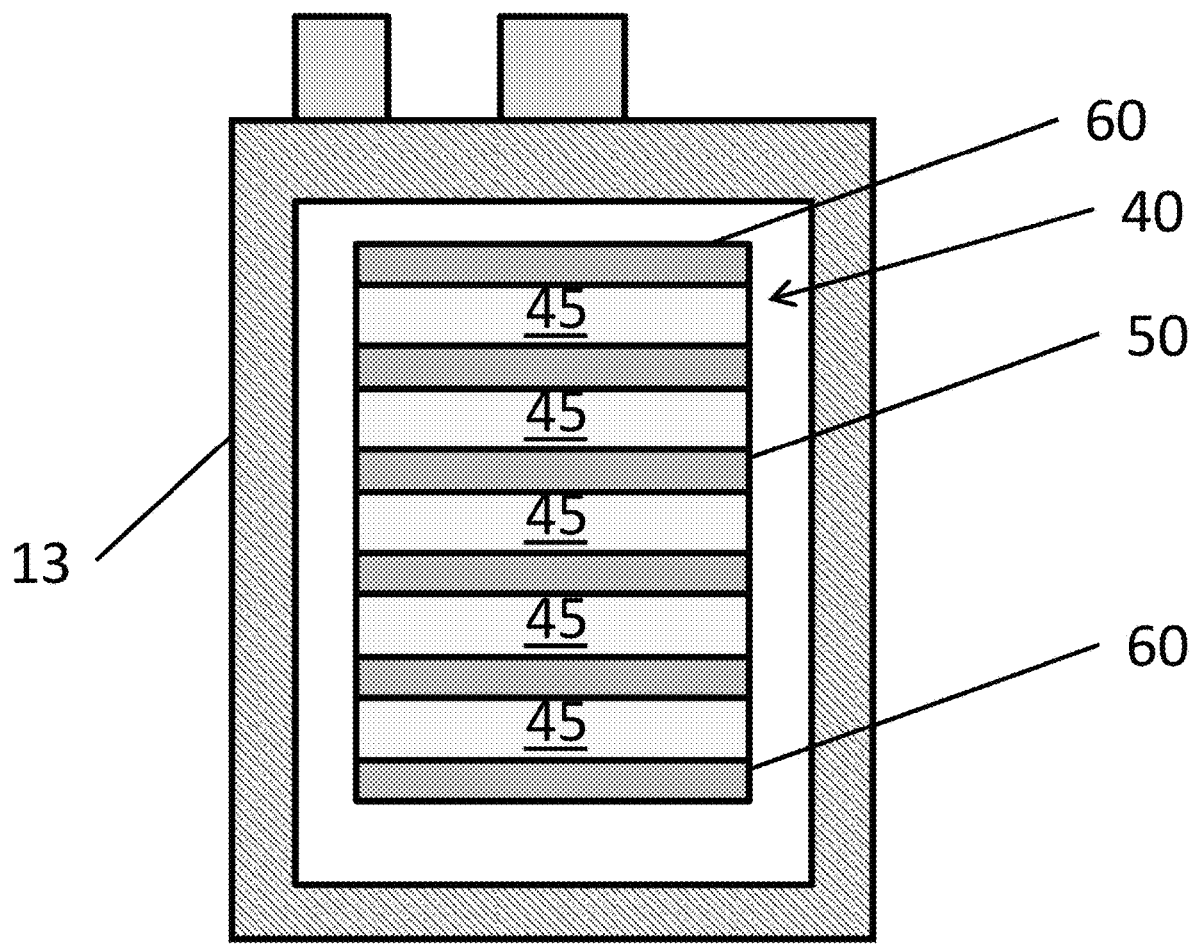
FIG. 2 is a schematic side cross-sectional view of a hot box according to various embodiments.

FIG. 2 illustrates a plan view of a fuel cell system hotbox 13 including a fuel cell stack or column 40. The hotbox 13 is shown to include the fuel cell stack or column 40. However, the hotbox 13 may include two or more of the stacks or columns 40. The stack or column 40 may include the electrically connected fuel cells 45 stacked on one another, with the interconnects 50 disposed between the fuel cells 45. The first and last fuel cells 45 in the stack or column are disposed between a respective end plate 60 and interconnect 50. The end plates 60 are electrically connected to electrical outputs of the fuel cell stack or column 40. The hotbox 13 may include other components, such as fuel conduits, air conduits, seals, electrical contacts, etc, and may be incorporated into a fuel cell system including balance of plant components. The fuel cells 45 may be solid oxide fuel cells containing a ceramic electrolyte, such as yttria stabilized zirconia (YSZ) or scandia stabilized zirconia (SSZ), an anode electrode, such as a nickel-YSZ, a Ni-SSZ or a nickel-samaria doped ceria (SDC) cermet, and a cathode electrode, such as lanthanum strontium manganite (LSM)). The interconnects 50 and/or end plates 60 may comprise any suitable gas impermeable and electrically conductive material, such as a chromium-iron alloy, such as an alloy containing 4 to 6 wt % iron and balance chromium. The interconnects 50 electrically connect adjacent fuel cells 45 and provide channels for fuel and air to reach the fuel cells 45.

Fuel cell systems, such as modular fuel cell system enclosure 10, may include and/or be augmented by various pieces of support equipment. Support equipment may include various auxiliary equipment and systems to support the operation of the fuel cell system. Support equipment may vary based on constraints and/or features at a site where the fuel cell system is installed. As non limiting examples, support equipment may include, fuel support equipment, air support equipment, and/or ventilation support equipment. One type of fuel support equipment may include equipment configured to control supply and/or exhaust fuel pressure in the fuel cell system, such as a fuel blower or pump to supply fuel to, recycle fuel/exhaust in, and/or exhaust fuel from the fuel cell system. Another type of fuel support equipment may be configured to process fuel for the fuel cell system, such as a fuel pre-heater, exhaust scrubber, etc. Other types of fuel support equipment may also be used. One type of air support equipment may be air supply equipment configured to provide air into the fuel cell system and/or exhaust air from the fuel cell system, such as blowers or fans to provide air to and/or exhaust air from a fuel cell cathode, an anode tail gas oxidizer (ATO), an air heat exchanger, a CPOx reactor, etc. Other types of air support equipment may also be used. One type of ventilation support equipment may include equipment configured to ventilate from and/or circulate air in portions of housings external of the hot box (e.g., portions within modular fuel cell system enclosure 10 but external of the hot box 13 itself), such as a ventilation fan 80 to blow air from within the enclosure 10 out of the enclosure 10 to maintain an acceptable enclosure 10 pressure. Other types of ventilation support equipment may also be used. Support equipment, especially support equipment including electric motors may require Alternating Current (AC) power, for example one, two, or three phase AC power, for operation.

There may be several applications of fuel cell systems, such as modular fuel cell system enclosure 10, that require support equipment for the fuel cell systems to be powered in different modes. One mode may be a start up mode. In a start up mode, the fuel cell system may not yet be capable of producing power and the support equipment may be powered by a source other than the fuel cell system, such as the grid or another start up power source.

Another mode may be a normal operation mode. In a normal operation mode the fuel cell system may supply power to the support equipment, and grid or start up power sources may also supply power or be capable of supplying power to the support equipment. In an embodiment, in normal operation mode, the parasitic load of the support equipment may be powered directly from the fuel cell system. The powering of the support equipment by the fuel cell system may be an efficient mode of operation. Additionally, in the event of a grid or start up power source failure, the support equipment may already be powered by the fuel cell system and thus no interruption may occur in the support equipment operation.

Another mode may be stand alone mode in which only power from the fuel cell system is available to the support equipment. An additional mode may be a failure mode occurring when power is not available to the support equipment, such as a grid or start up power source outage during the start up mode or a fuel cell system failure during the stand alone mode.

FIGS. 3A-10 illustrate various embodiments of a fuel cell IT grid system 300 electrically connected to varying numbers and combinations of load balancing loads 306, which may also be referred to herein as a mechanical load 600 or an electrical utility grid 802 of an electric utility provider in non-limiting examples. A fuel cell IT grid system 300 may include a variety of components, including one or more control devices 301 configured to receive data signals from and send control signals to any number and combination of power modules 12, a DC/DC converter 302, a DC power bus 304, a DC/AC inverter 308, and an IT load 310 configured to operate using AC electrical current. In various embodiments of the fuel cell IT grid system 300, the IT load 310 may be configured to operate using DC electrical current, and the DC/AC inverter 308 may be omitted from the fuel cell IT grid system 300. The control device(s) 301 may be any form of programmable computing device or system, such as a server or overall system control device 301, that is configured to perform operations of various embodiments, including operations of the method illustrated in FIG. 11. FIGS. 3A-10 illustrate various embodiments that are meant to be illustrative examples and not limiting of the scope of the claims.

A fuel cell IT grid system 300 may include any number "N" of power modules 12 that may be configured as described herein with reference to FIG. 1. In various embodiments, the number of power modules 12 may be at least as many power modules 12 necessary to generate sufficient electrical power to satisfy at least normal electrical power demands of an IT load 310. In various embodiments, the number of power modules 12 may include any number of redundant power modules 12 so that in case of reduced or no electrical output from at least one power module 12, a redundant power module 12 may be used to continue supply of the electrical power demand of the IT load 310. Similarly, a power module may include a redundant fuel cell stack (not shown) so that in case of reduced or no electrical output from at least one fuel cell stack of a power module 12, a redundant fuel cell stack may be used to continue supply of the electrical power demand of the IT load 310.

The power module 12 may be configured in a manner in which the power module 12 has a temperature threshold at which fatigue or damage the components of the power module 12 from repeatedly cycling components of the power module 12 from temperatures below the threshold to temperatures above the temperature threshold. In various embodiments, a power module 12 may be controlled to maintain a temperature above the temperature threshold. Control of a power module 12 to maintain a temperature above the temperature threshold may be based on temperature readings of components of the power module 12 and/or an electrical output of the power module 12. In various embodiments, a power module 12 may include a control device 301 configured to control the power module 12 to maintain a temperature above the temperature threshold. In various embodiments, control device 301 may be communicatively connected to any number of power modules 12 and configured to control each of the power modules 12 to maintain respective temperatures above the temperature threshold.

A power module 12 may be electrically connected to a DC/DC converter 302, and may supply a DC electrical current to the DC/DC converter 302 via an electrical conduit. The DC/DC converter 302 may be configured to convert a DC electrical current received from an electrical power source to a higher or lower voltage. A DC/DC converter 302 may be unidirectional, configured to receive electrical power at an input end and to supply electrical power at an output end. In various embodiments, the electrical power source may include a power module 12. A DC/DC converter 302 may be electrically connected at an input end to a power module 12 and electrically connected to a DC power bus 304 at an output end. A DC electrical current received by a DC/DC converter 302 from a power module 12 may be converted by the DC/DC converter 302 and supplied to a DC power bus 304. In various embodiments, a DC/DC converter 302 may be configured to supply a designated voltage and/or amperage electrical power based on electrical power capacity of a fuel cell IT grid system 300 and/or an electrical power demand of IT loads 310. A designated voltage and/or amperage electrical power supplied by a DC/DC converter 302 may be based on voltage and/or amperage electrical power supplied by other DC/DC converter 302 or on a DC power bus 304. A fuel cell IT grid system 300 may include any number "M" of DC/DC converters 302 disposed between N power modules 12 and a DC power bus 304. In various embodiments, a fuel cell IT grid system 300 may include a one-to-one ratio of power modules 12 to DC/DC converters 302. In various embodiments, a fuel cell IT grid system 300 may include a one-to-many ratio of power modules 12 to DC/DC converters 302.

A DC power bus 304 may be configured as a common electrical conduit for multiple electrical power sources. In various embodiments, the electrical power sources may include any number and combination of a power modules 12, a power storage device 402, and/or an electrical utility grid 802. A DC power bus 304 may be electrically connected to electrical power sources via other components of a fuel cell IT grid system 300, such as DC/DC converters 302, DC disconnects 400, and/or bidirectional DC/AC inverters 800. A DC power bus 304 may be configured to transmit electrical power to a load. In various embodiments, the load may include any number and combination of an IT load 310 and a load balancing load 306. A DC power bus 304 may be electrically connected to multiple IT loads 310 via other components of a fuel cell IT grid system 300, such as DC/AC inverters 308.

A DC/AC inverter 308 may be configured to invert a DC electrical current received from an electrical power source to an AC electrical current. A DC/AC inverter 308 may be unidirectional, configured to receive electrical power at an input end and to supply electrical power at an output end. In various embodiments, the electrical power source may include any number and combination of a power module 12, a power storage device 402, and/or an electrical utility grid 802. A DC/AC inverter 308 may be electrically connected at an input end to an electrical power source and electrically connected to an IT load 310 at an output end. A DC/AC inverter 308 may be electrically connected to an electrical power source via other components of a fuel cell IT grid system 300, such as a DC power bus 304, a DC/DC converter 302, and/or a bidirectional DC/AC inverter 800. A DC electrical current received by a DC/AC inverter 308 from an electrical power source may be inverted by the DC/AC inverter 308 and supplied to an IT load 310. In various embodiments, a DC/AC inverter 308 may be configured to supply a designated voltage and/or amperage electrical power based on electrical power configuration of an IT load 310 and/or an electrical power demand of the IT load 310. A fuel cell IT grid system 300 may include any number "P" of DC/AC inverters 308, each disposed between a DC power bus 304 and an IT load 310. In various embodiments, a fuel cell IT grid system 300 may include a one-to-one ratio of DC/AC inverters 308 to IT loads 310. In various embodiments, a fuel cell IT grid system 300 may include a one-to-many ratio of DC/AC inverters 308 to IT loads 310.

An IT load 310 may be configured to consume electrical power in a fuel cell IT grid system 300. In various embodiments, electrical power may be provided to a fuel cell IT grid system 300 by any number and combination of a power modules 12, a power storage device 402, and/or an electrical utility grid 802. An IT load 310 may include any number and combination of computing devices, such as servers, network switches, routers, supercomputers, and/or quantum computers. A fuel cell IT grid system 300 may include any number "Q" of IT loads 310. A voltage and/or amperage of electrical power required by an IT load 310 may be an electrical power demand of an IT load 310 on a fuel cell IT grid system 300. Multiple IT loads 310 require voltage and/or amperage of electrical power to be within specific requirements, and combined these requirements present the electrical power demand of the IT load 310 on a fuel cell IT grid system 300.

A load balancing load 306 may be configured to receive electrical power generated in a fuel cell IT grid system 300 beyond an electrical power demand of an IT load 310. In some embodiments, a load balancing load 306 may be configured to consume electrical power generated in a fuel cell IT grid system 300 beyond an electrical power demand of an IT load 310. In some embodiments, a load balancing load 306 may be configured to store and distribute an electrical power generated in a fuel cell IT grid system 300 beyond an electrical power demand of an IT load 310. A load balancing load 306 may include any number and combination of a load bank, a mechanical load 600, an electrical load, and/or a power storage device. A load bank may include any form of load bank configured to dissipate energy, such as by dissipating electrical power as heat energy, including a resistive load bank, an inductive load bank, a capacitive load bank, and/or a combined load bank. A mechanical load 600 may include, for example, an IT load cooling system, an HVAC system, a gas and/or liquid pumping system, a fan, a vent, etc. An electrical load may include, for example, a lighting system, a security system, etc. A power storage device may include any form of power storage including electromagnetic power storage, mechanical power storage, electrochemical power storage, chemical power storage, and/or thermal power storage.

Figure 3A:
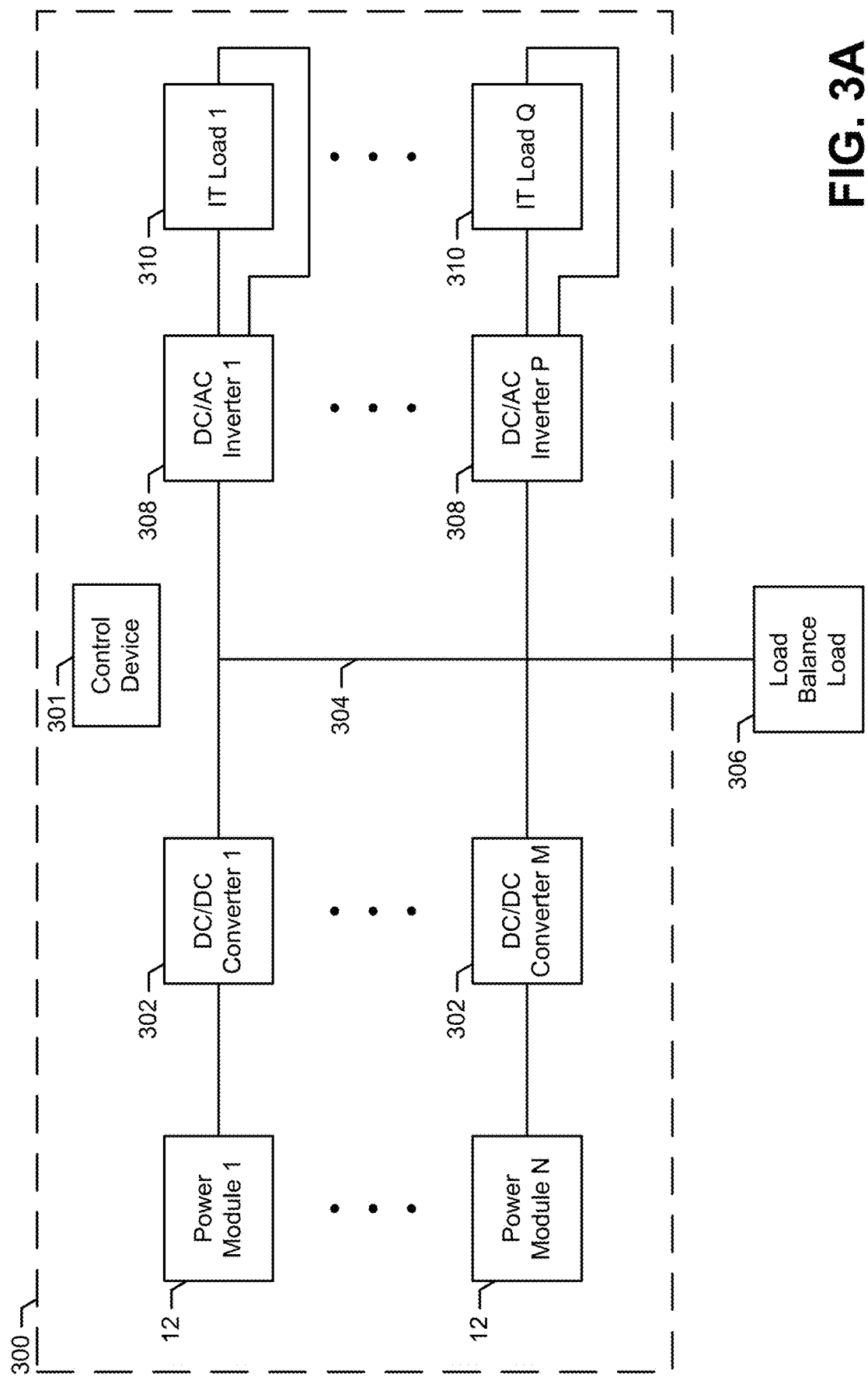
FIG. 3A is a block diagram of a fuel cell information technology (IT) grid system according to some embodiments.

FIG. 3A illustrates an example of a fuel cell IT grid system 300 electrically connected to varying numbers and combinations of load balancing loads 306. The fuel cell IT grid system 300 may include N number of power modules 12. The power modules 12 may be electrically connected in parallel to a DC power bus 304. The fuel cell IT grid system 300 may include M number of DC/DC converters 302. Each power module 12 may be electrically connected to a DC/DC converter 302. The fuel cell IT grid system 300 may include a one-to-one ratio of power modules 12 to DC/DC converters 302. The DC/DC converters 302 may be electrically connected in parallel to the DC power bus 304. Each DC/DC converter 302 may be electrically connected between a power module 12 and the DC power bus 304.

The fuel cell IT grid system 300 may include Q number of IT loads 310. The IT loads 310 may be electrically connected in parallel to the DC power bus 304. In various embodiments, the electrical connection between an IT load 310 and the DC power bus 304 may be dual corded, which may increase reliability of electrical power supply from the DC power bus 304 to the IT load 310 by providing redundant electrical connections. The fuel cell IT grid system 300 may include P number of DC/AC inverters 308. Each IT load 310 may be electrically connected to a DC/AC inverter 308. In various embodiments, the dual corded electrical connection between an IT load 310 and the DC power bus 304 may be dual corded between an IT load 310 and an associated DC/AC inverter 308, which may increase reliability of electrical power supply from the associated DC/AC inverter 308 to the IT load 310 by providing redundant electrical connections. The fuel cell IT grid system 300 may include a one-to-one ratio of IT loads 310 to DC/AC inverters 308. The DC/AC inverters 308 may be electrically connected in parallel to the DC power bus 304. Each DC/AC inverters 308 may be electrically connected between an IT load 310 and the DC power bus 304.

The fuel cell IT grid system 300 may be electrically connected to any number or combination of load balancing loads 306. The fuel cell IT grid system 300 may be electrically connected to a load balancing load 306 via the DC power bus 304. The load balancing load 306 may receive excess electrical power in the fuel cell IT grid system 300, generated by a combination of the power modules 12, beyond the electrical power demand of the IT loads 310. The fuel cell IT grid system 300 may include a control device 301 configured to control connections to the load balancing load 306 to implement methods of various embodiments.

FIG. 3B illustrates an example of a fuel cell IT grid system 300 electrically connected to varying numbers and combinations of load balancing loads 306. The fuel cell IT grid system 300 may include N number of power modules 12. The power modules 12 may be electrically connected in parallel to multiple DC power busses 304. The fuel cell IT grid system 300 may include M number of DC/DC converters 302. Each power module 12 may be electrically connected to multiple DC/DC converters 302. The fuel cell IT grid system 300 may include a one-to-many ratio of power modules 12 to DC/DC converters 302. The DC/DC converters 302 may be electrically connected in parallel to the DC power busses 304. In various embodiments, a first DC/DC converter 302 electrically connected to a power module 12 may be electrically connected to a first DC power bus 304, and a second DC/DC converter 302 electrically connected to the power module 12 may be electrically connected to a second DC power bus 304. Configurations of the fuel cell IT grid system 300 including multiple DC power busses 304 and multiple DC/DC converter 302 electrically connected to associated power modules 12 may increase reliability of electrical power supply from the power modules 12 to the IT loads 310 by providing redundant electrical components and connections. Each DC/DC converter 302 may be electrically connected between a power module 12 and a DC power bus 304. The fuel cell IT grid system 300 may include a control device 301 configured to control connections to the load balancing load 306 to implement methods of various embodiments.

The fuel cell IT grid system 300 may include Q number of IT loads 310. The IT loads 310 may be electrically connected in parallel to the DC power busses 304. In various embodiments, the electrical connection between an IT load 310 and the DC power busses 304 may be dual corded, which may increase reliability of electrical power supply from the DC power busses 304 to the IT load 310 by providing redundant electrical connections. In various embodiments, an IT load 310 may be electrically connected to the first DC power bus 304 and the second DC power bus 304. The fuel cell IT grid system 300 may include P number of DC/AC inverters 308. Each IT load 310 may be electrically connected to a DC/AC inverter 308. In various embodiments, the dual corded electrical connection between an IT load 310 and the DC power busses 304 may be dual corded between an IT load 310 and an associated DC/AC inverter 308, which may increase reliability of electrical power supply from the power modules 12 to the IT load 310 by providing redundant electrical connections. The fuel cell IT grid system 300 may include a one-to-one ratio of IT loads 310 to DC/AC inverters 308. The DC/AC inverters 308 may be electrically connected in parallel to the DC power busses 304. In various embodiments, a DC/AC inverter 308 electrically connected to a power module 12 may be electrically connected to the first DC power bus 304 and the second DC power bus 304. Each DC/AC inverter 308 may be electrically connected between an IT load 310 and the DC power busses 304.

The fuel cell IT grid system 300 may be electrically connected to any number or combination of load balancing loads 306. The fuel cell IT grid system 300 may be electrically connected to a load balancing load 306 via at least one of the DC power busses 304. In various embodiments, the fuel cell IT grid system 300 may be electrically connected to a load balancing load 306 via multiple DC power busses 304. In various embodiments, the fuel cell IT grid system 300 may be electrically connected to multiple load balancing loads 306 by electrically connecting each load balancing load 306 to a DC power bus 304. The load balancing load 306 may receive excess electrical power in the fuel cell IT grid system 300, generated by a combination of the power modules 12, beyond the electrical power demand of the IT loads 310.

Figure 3C:
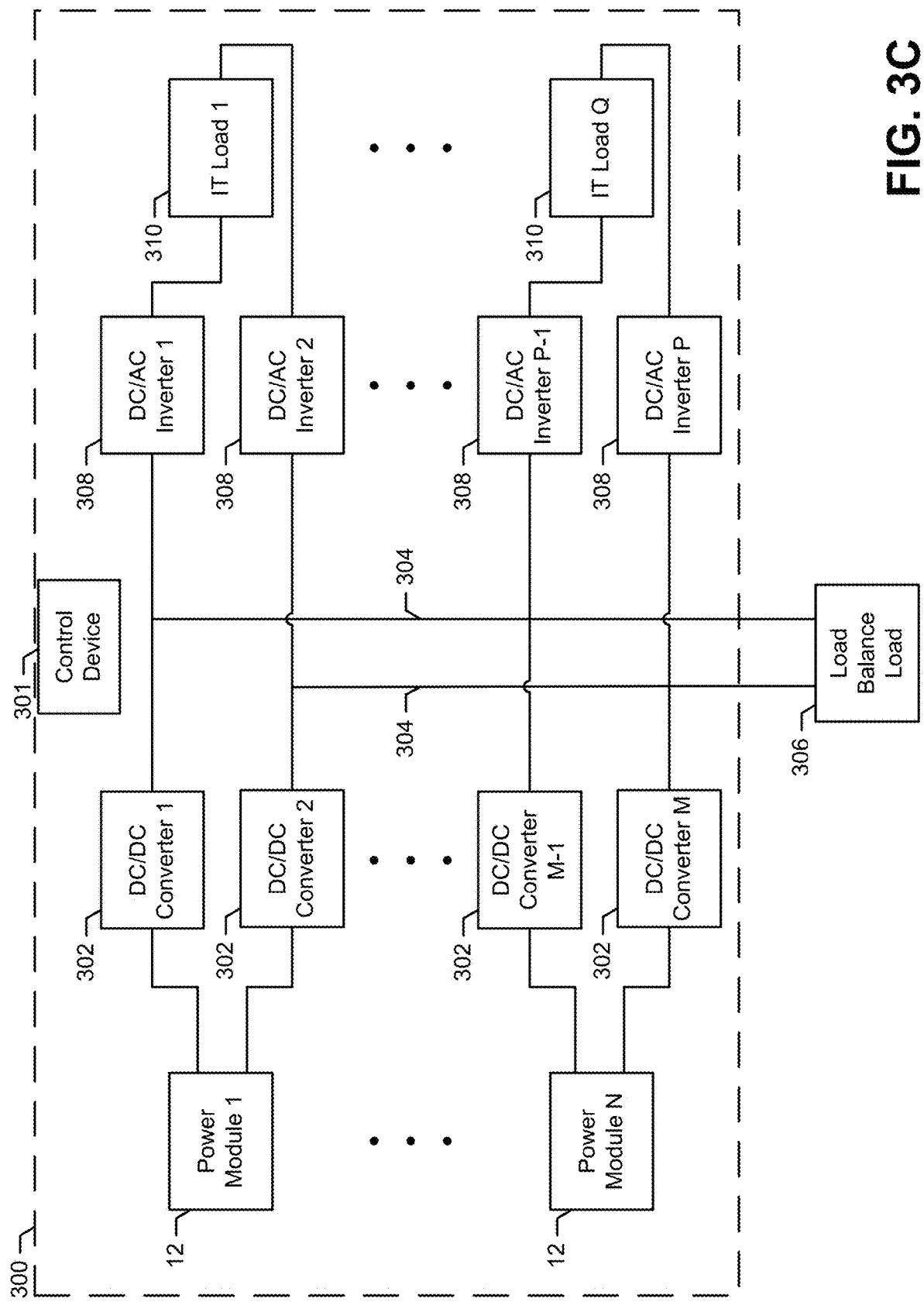
FIG. 3C is a block diagram of a fuel cell IT grid system according to some embodiments.

FIG. 3C illustrates an example of a fuel cell IT grid system 300 electrically connected to varying numbers and combinations of load balancing loads 306. The fuel cell IT grid system 300 may include N number of power modules 12. The power modules 12 may be electrically connected in parallel to multiple DC power busses 304. The fuel cell IT grid system 300 may include M number of DC/DC converters 302. Each power module 12 may be electrically connected to multiple DC/DC converters 302. The fuel cell IT grid system 300 may include a one-to-many ratio of power modules 12 to DC/DC converters 302. The DC/DC converters 302 may be electrically connected in parallel to the DC power busses 304. In various embodiments, a first DC/DC converter 302 electrically connected to a power module 12 may be electrically connected to a first DC power bus 304, and a second DC/DC converter 302 electrically connected to the power module 12 may be electrically connected to a second DC power bus 304. Configurations of the fuel cell IT grid system 300 including multiple DC power busses 304 and multiple DC/DC converter 302 electrically connected to associated power modules 12 may increase reliability of electrical power supply from the power modules 12 to the IT loads 310 by providing redundant electrical components and connections. Each DC/DC converter 302 may be electrically connected between a power module 12 and a DC power bus 304.

The fuel cell IT grid system 300 may include Q number of IT loads 310. The IT loads 310 may be electrically connected in parallel to the DC power busses 304. In various embodiments, the electrical connection between an IT load 310 and the DC power busses 304 may be dual corded, which may increase reliability of electrical power supply from the DC power busses 304 to the IT load 310 by providing redundant electrical connections. In various embodiments, an IT load 310 may be electrically connected to the first DC power bus 304 and the second DC power bus 304. The fuel cell IT grid system 300 may include P number of DC/AC inverters 308. Each IT load 310 may be electrically connected to multiple DC/AC inverters 308. The fuel cell IT grid system 300 may include a one-to-many ratio of IT loads 310 to DC/AC inverters 308. The DC/AC inverters 308 may be electrically connected in parallel to the DC power busses 304. In various embodiments, a first DC/AC inverter 308 electrically connected to an IT load 310 may be electrically connected to the first DC power bus 304, and a second DC/AC inverter 308 electrically connected to the IT load 310 may be electrically connected to the second DC power bus 304. Configurations of the fuel cell IT grid system 300 including multiple DC power busses 304 and multiple DC/AC inverters 308 electrically connected to associated IT loads 310 may increase reliability of electrical power supply from the power modules 12 to the IT loads 310 by providing redundant electrical components and connections. Each DC/AC inverter 308 may be electrically connected between an IT load 310 and a DC power bus 304.

The fuel cell IT grid system 300 may be electrically connected to any number or combination of load balancing loads 306. The fuel cell IT grid system 300 may be electrically connected to a load balancing load 306 via at least one of the DC power busses 304. In various embodiments, the fuel cell IT grid system 300 may be electrically connected to a load balancing load 306 via multiple DC power busses 304. In various embodiments, the fuel cell IT grid system 300 may be electrically connected to multiple load balancing loads 306 by electrically connecting each load balancing load 306 to a DC power bus 304. The load balancing load 306 may receive excess electrical power in the fuel cell IT grid system 300, generated by a combination of the power modules 12, beyond the electrical power demand of the IT loads 310.

Figure 3D:
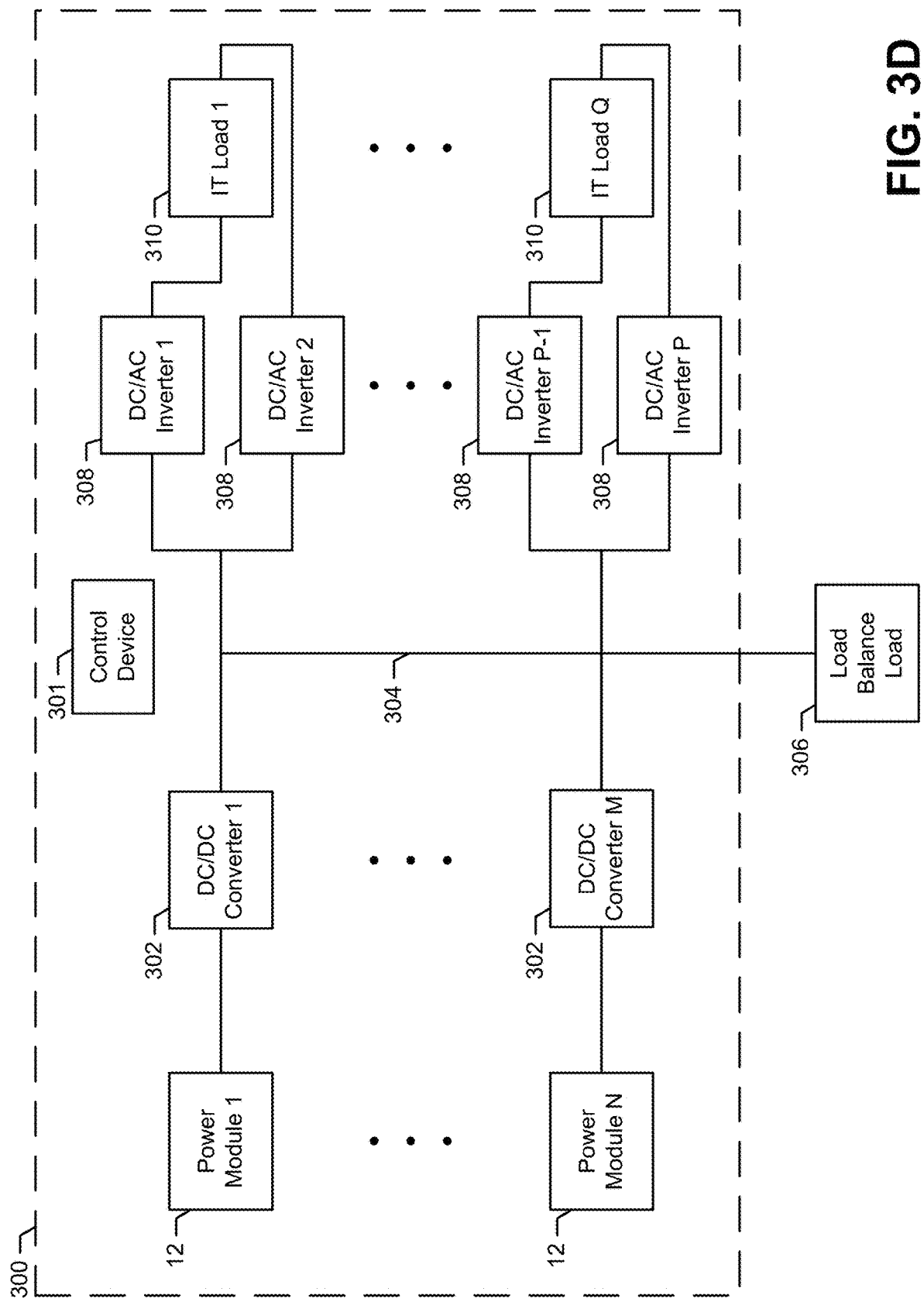
FIG. 3D is a block diagram of a fuel cell IT grid system according to some embodiments.

FIG. 3D illustrates an example of a fuel cell IT grid system 300 electrically connected to varying numbers and combinations of load balancing loads 306. The fuel cell IT grid system 300 may include N number of power modules 12. The power modules 12 may be electrically connected in parallel to a DC power bus 304. The fuel cell IT grid system 300 may include M number of DC/DC converters 302. Each power module 12 may be electrically connected to a DC/DC converter 302. The fuel cell IT grid system 300 may include a one-to-one ratio of power modules 12 to DC/DC converters 302. The DC/DC converters 302 may be electrically connected in parallel to the DC power bus 304. Each DC/DC converter 302 may be electrically connected between a power module 12 and the DC power bus 304. The fuel cell IT grid system 300 may include a control device 301 configured to control connections to the load balancing load 306 to implement methods of various embodiments.

The fuel cell IT grid system 300 may include Q number of IT loads 310. The IT loads 310 may be electrically connected in parallel to the DC power bus 304. In various embodiments, the electrical connection between an IT load 310 and the DC power bus 304 may be dual corded, which may increase reliability of electrical power supply from the DC power bus 304 to the IT load 310 by providing redundant electrical connections. The fuel cell IT grid system 300 may include P number of DC/AC inverters 308. Each IT load 310 may be electrically connected to multiple DC/AC inverters 308. The fuel cell IT grid system 300 may include a one-to-many ratio of IT loads 310 to DC/AC inverters 308. The DC/AC inverters 308 may be electrically connected in parallel to the DC power bus 304. In various embodiments, a first DC/AC inverter 308 electrically connected to an IT load 310 may be electrically connected to the DC power bus 304, and a second DC/AC inverter 308 electrically connected to the IT load 310 may be electrically connected to the DC power bus 304. Configurations of the fuel cell IT grid system 300 including multiple DC/AC inverters 308 electrically connected to associated IT loads 310 may increase reliability of electrical power supply from the power modules 12 to the IT loads 310 by providing redundant electrical components and connections. Each DC/AC inverter 308 may be electrically connected between an IT load 310 and a DC power bus 304.

The fuel cell IT grid system 300 may be electrically connected to any number or combination of load balancing loads 306. The fuel cell IT grid system 300 may be electrically connected to a load balancing load 306 via the DC power bus 304. The load balancing load 306 may receive excess electrical power in the fuel cell IT grid system 300, generated by a combination of the power modules 12, beyond the electrical power demand of the IT loads 310.

FIG. 3E illustrates an example of multiple fuel cell IT grid systems 300 electrically connected to varying numbers and combinations of load balancing loads 306. Any number "R" fuel cell IT grid systems 300 may be may be electrically connected to any number or combination of load balancing loads 306. The fuel cell IT grid systems 300 may be electrically connected to a load balancing load 306 via a DC power bus 304. The load balancing load 306 may receive excess electrical power in the fuel cell IT grid system 300, generated by a combination of the power modules 12, beyond the electrical power demand of the IT loads 310. In various embodiments, the fuel cell IT grid systems 300 may include any combination of configurations of fuel cell IT grid systems 300, such as the configurations of the fuel cell IT grid systems 300 described herein.

As illustrated in FIGS. 4-10, a fuel cell IT grid system 300 may include any number and combination of a power storage device 402 and an electrical protection component configured to interrupt the flow of electrical current in the fuel cell IT grid system 300. In various embodiments, a fuel cell IT grid system 300 may include a transformer 406. FIGS. 4-10 illustrate various embodiments that are meant to be illustrative examples and not limiting of the scope of the claims.

Referring to FIGS. 4-10 collectively, a power storage device 402 may include any number and combination of power storage devices 402. For example, a power storage device 402 may include any form of power storage including electromagnetic power storage, mechanical power storage, electrochemical power storage, chemical power storage, and/or thermal power storage. Some non-limiting examples include a capacitor, a flywheel, and/or a battery. A power storage device 402 may increase reliability of electrical power supply to an IT load 310 by providing redundant electrical power supply. In case of insufficient, reduced, or no electrical output from a power module 12, a power storage device 402 may be used to augment or continue supply of an electrical power demand of an IT load 310. A power storage device 402 may be configured to store electrical power generated by a power module 12. A power storage device 402 may be configured to supply stored electrical power in response to generation of electrical power in a fuel cell IT grid system 300 below an electrical power demand of IT loads 310 of the fuel cell IT grid system 300. A power storage device 402 may receive electrical power from an electrical power source and output the stored electrical power to a DC power bus 304. A fuel cell IT grid system 300 may include any number "S" of DC/DC converters 302, each disposed between a power module 12 and a DC power bus 304. In various embodiments, the electrical power source may include a power module 12, a power storage device 402, and/or an electrical utility grid 802. The fuel cell IT grid system 300 may include a control device 301 configured to control connections to the power storage device 402 and/or a load balancing load 306 to implement methods of various embodiments.

An electrical protection component may include a fuse, a circuit breaker, and/or a switch. In various embodiments, an electrical protection component may include a DC disconnect 400. A DC disconnect 400 may be configured to connect and disconnect any number and combination of components of a fuel cell IT grid system 300 from a DC power bus 304. A DC disconnect 400 may be configured with a threshold electrical power tolerance. A DC disconnect 400 may be normally configured to connect any number and combination of components of a fuel cell IT grid system 300 to a DC power bus 304. Electrical power supplied to a DC disconnect 400 exceeding its threshold electrical power tolerance may trigger disconnection of any number and combination of components of a fuel cell IT grid system 300 from a DC power bus 304 by the DC disconnect 400. In various embodiments, a DC disconnect 400 may selectively connect and disconnect any number and combination of components of a fuel cell IT grid system 300 from the DC power bus 304. In various embodiments, components of a fuel cell IT grid system 300 may include a power module 12, a power storage device 402, and/or a DC/DC converter 302. In various embodiments, components of a fuel cell IT grid system 300 may include a DC/AC inverter 308, a circuit breaker 404, a transformer 406, and/or an IT load 310 configured to operate using AC electrical current. In various embodiments of the fuel cell IT grid system 300, the IT load 310 may be configured to operate using DC electrical current, and the DC/AC inverter 308 may be omitted from the fuel cell IT grid system 300.

In various embodiments, an electrical protection component may include a circuit breaker 404. A circuit breaker 404 may be configured to connect and disconnect any number and combination of components of a fuel cell IT grid system 300 from the fuel cell IT grid system 300. A circuit breaker 404 may be configured with a threshold electrical power tolerance. A circuit breaker 404 may be normally configured to connect any number and combination of components of a fuel cell IT grid system 300 to the fuel cell IT grid system 300. Electrical power supplied to a circuit breaker 404 exceeding its threshold electrical power tolerance may trigger disconnection of any number and combination of components of a fuel cell IT grid system 300 from the fuel cell IT grid system 300 by the circuit breaker 404. In various embodiments, components of a fuel cell IT grid system 300 may include a transformer 406 and/or an IT load 310.

A transformer 406 may be configured to increase or decrease a voltage of an electrical power received from an electrical power source. A transformer 406 may be configured to receive electrical power at an input end and to supply electrical power at an output end. In various embodiments, the electrical power source may include any number and combination of a power module 12, a power storage device 402, and/or an electrical utility grid 802. A transformer 406 may be electrically connected at an input end to an electrical power source and electrically connected to an IT load 310 at an output end. A transformer 406 may be electrically connected to an electrical power source via other components of a fuel cell IT grid system 300 may, such as a DC/AC inverter 308, a DC power bus 304, and/or a DC/DC converter 302. A DC electrical current received by a transformer 406 from an electrical power source via a DC power bus 304 may have its voltage increased or decreased by the transformer 406 and supplied to an IT load 310. An AC electrical current received by a transformer 406 from an electrical power source via a DC/AC inverter 308 may have its voltage increased or decreased by the transformer 406 and supplied to an IT load 310. In various embodiments, a transformer 406 may be configured to supply a designated voltage electrical power based on electrical power configuration of an IT load 310 and/or an electrical power demand of the IT load 310. A fuel cell IT grid system 300 may include P number of transformers 406, each disposed between a DC power bus 304 and an IT load 310. In various embodiments, each transformer 406 may be more specifically disposed between a DC/AC inverter 308 and an IT load 310. In various embodiments, a fuel cell IT grid system 300 may include a one-to-one ratio of transformers 406 to IT loads 310. In various embodiments, a fuel cell IT grid system 300 may include a one-to-many ratio of transformers 406 to IT loads 310. In various embodiments, a transformer 406 may be optional. A transformer 406 may be included on a fuel cell IT grid system 300 for mismatches in the native voltages of the power modules 12 and the IT loads 310, and may be excluded for power modules 12 and the IT loads 310 with matching native voltages.

Figure 4:
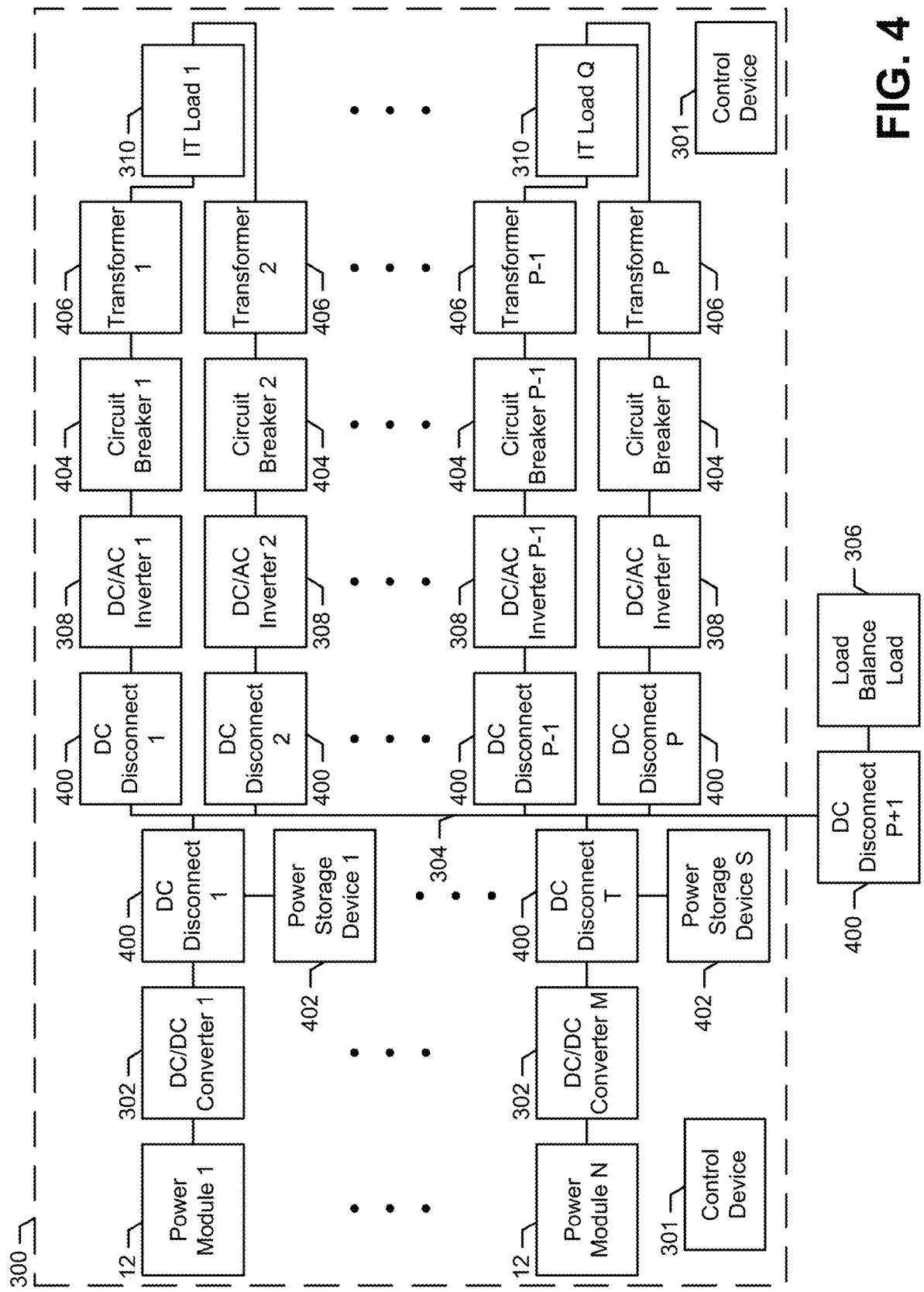
FIG. 4 is a block diagram of a fuel cell IT grid system according to some embodiments.

FIG. 4 illustrates an example of a fuel cell IT grid system 300 electrically connected to varying numbers and combinations of load balancing loads 306. The fuel cell IT grid system 300 may include N number of power modules 12. The power modules 12 may be electrically connected in parallel to a DC power bus 304. The fuel cell IT grid system 300 may include M number of DC/DC converters 302. Each power module 12 may be electrically connected to a DC/DC converter 302. The fuel cell IT grid system 300 may include a one-to-one ratio of power modules 12 to DC/DC converters 302. The DC/DC converters 302 may be electrically connected in parallel to the DC power bus 304. Each DC/DC converter 302 may be electrically connected between a power module 12 and the DC power bus 304.

The fuel cell IT grid system 300 may include S number of power storage devices 402. Each power storage device 402 may be electrically connected to a power module 12. A power storage device 402 may be electrically connected to a power module 12 via a DC/DC converter 302. The power storage devices 402 may be electrically connected to the DC power bus 304 in parallel.

The fuel cell IT grid system 300 may include any number of T electrical protection components configured to electrically connect and disconnect the DC power bus 304 from the power modules 12 and/or the power storage devices 402. In various embodiments, the electrical protection components may include DC disconnects 400. Each DC disconnect 400 may be configured to connect and disconnect a power module 12 and/or a power storage device 402 from the DC power bus 304. In various embodiments, the DC disconnect 400 may selectively connect and disconnect one or both of the power module 12 and the power storage device 402. In various embodiments, the DC disconnect 400 may similarly and additionally connect and disconnect a DC/DC converter 302 from the DC power bus 304.

The fuel cell IT grid system 300 may include Q number of IT loads 310. The IT loads 310 may be electrically connected in parallel to the DC power bus 304. In various embodiments, the electrical connection between an IT load 310 and the DC power bus 304 may be dual corded, which may increase reliability of electrical power supply from the DC power bus 304 to the IT load 310 by providing redundant electrical connections. The fuel cell IT grid system 300 may include P number of DC/AC inverters 308. Each IT load 310 may be electrically connected to multiple DC/AC inverters 308. The fuel cell IT grid system 300 may include a one-to-many ratio of IT loads 310 to DC/AC inverters 308. The DC/AC inverters 308 may be electrically connected in parallel to the DC power bus 304. In various embodiments, a first DC/AC inverter 308 electrically connected to an IT load 310 may be electrically connected to the DC power bus 304, and a second DC/AC inverter 308 electrically connected to the IT load 310 may be electrically connected to the DC power bus 304. Configurations of the fuel cell IT grid system 300 including multiple DC/AC inverters 308 electrically connected to associated IT loads 310 may increase reliability of electrical power supply from the power modules 12 to the IT loads 310 by providing redundant electrical components and connections. Each DC/AC inverter 308 may be electrically connected between an IT load 310 and a DC power bus 304.

The fuel cell IT grid system 300 may include P number of transformers 406. Each IT load 310 may be electrically connected to multiple transformers 406. The fuel cell IT grid system 300 may include a one-to-many ratio of IT loads 310 to transformers 406. The transformers 406 may be electrically connected in parallel to the DC power bus 304. In various embodiments, a first transformer 406 electrically connected to an IT load 310 may be electrically connected to the DC power bus 304, and a second transformer 406 electrically connected to the IT load 310 may be electrically connected to the DC power bus 304. Each transformer 406 may be electrically connected to the DC power bus 304 via a DC/AC inverter 308. Configurations of the fuel cell IT grid system 300 including multiple transformers 406 electrically connected to associated IT loads 310 may increase reliability of electrical power supply from the power modules 12 to the IT loads 310 by providing redundant electrical components and connections. Each transformer 406 may be electrically connected between an IT load 310 and a DC power bus 304. In various embodiments, a fuel cell IT grid system 300 may include a one-to-many ratio of transformers 406 to IT loads 310. In various embodiments, a transformer 406 may be optional. A transformer 406 may be included on a fuel cell IT grid system 300 for mismatches in the native voltages of the power modules 12 and the IT loads 310, and may be excluded for power modules 12 and the IT loads 310 with matching native voltages.

The fuel cell IT grid system 300 may include P number of electrical protection components configured to electrically connect and disconnect the DC power bus 304 from IT loads 310. In various embodiments, the electrical protection components may include DC disconnects 400. Each DC disconnect 400 may be configured to connect and disconnect an IT load 310 from the DC power bus 304. In various embodiments, the DC disconnect 400 may similarly and additionally connect and disconnect a DC/AC inverter 308, a circuit breaker 404, and/or a transformer 406 from the DC power bus 304. In various embodiments, the DC disconnect 400 may connect and disconnect one of multiple inputs of the IT load 310 from the DC power bus 304.

The fuel cell IT grid system 300 may include P number of electrical protection components configured to electrically connect and disconnect components of a fuel cell IT grid system 300 from the fuel cell IT grid system 300. In various embodiments, the electrical protection components may include circuit breakers 404. In various embodiments, components of a fuel cell IT grid system 300 may include a transformer 406 and/or an IT load 310. Each circuit breaker 404 may be configured to connect and disconnect an IT load 310 from the fuel cell IT grid system 300. In various embodiments, the circuit breaker 404 may similarly and additionally connect and disconnect a transformer 406 from the fuel cell IT grid system 300. In various embodiments, the circuit breaker 404 may connect and disconnect one of multiple inputs of the IT load 310 from the fuel cell IT grid system 300. In various embodiments, the circuit breaker 404 may be electrically connected between an IT load 310 and a DC/AC inverter 308. In various embodiments, the circuit breaker 404 may be electrically connected between a transformer 404 electrically connected to an IT load 310 and a DC/AC inverter 308.

The fuel cell IT grid system 300 may be electrically connected to any number or combination of load balancing loads 306. The fuel cell IT grid system 300 may be electrically connected to a load balancing load 306 via the DC power bus 304. The load balancing load 306 may receive excess electrical power in the fuel cell IT grid system 300, generated by a combination of the power modules 12, beyond the electrical power demand of the IT loads 310. In various embodiments, the load balancing load 306 may be electrically connected to and disconnected from the fuel cell IT grid system 300 by electrical protection components. In various embodiments, an electrical protection component may include a DC disconnect 400.

The fuel cell IT grid system 300 may include a control device 301 configured to receive signals from and control connections to the various components of the system to implement methods of various embodiments.

Figure 5:
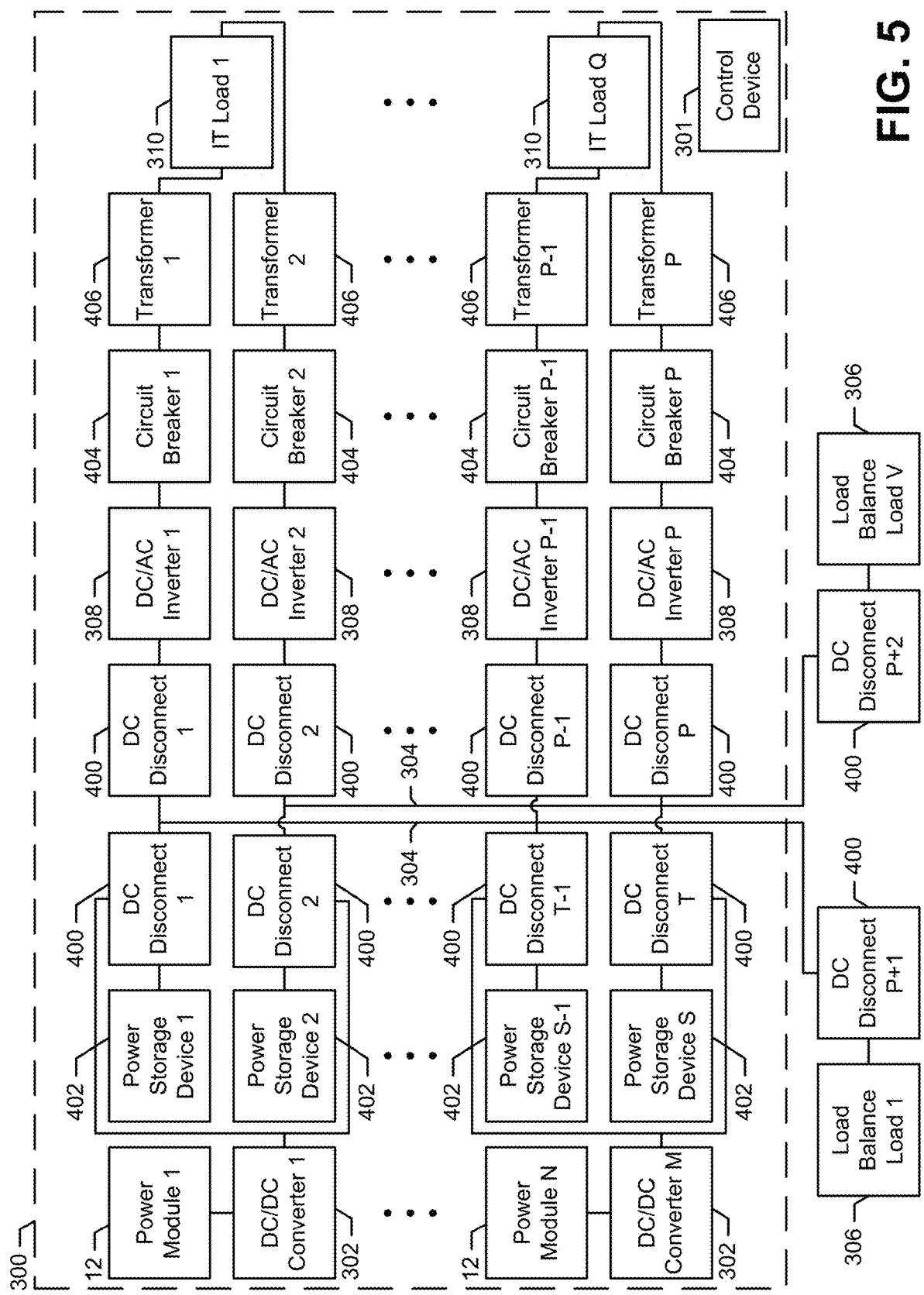
FIG. 5 is a block diagram of a fuel cell IT grid system according to some embodiments.

FIG. 5 illustrates an example of a fuel cell IT grid system 300 electrically connected to varying numbers and combinations of load balancing loads 306. The fuel cell IT grid system 300 may include N number of power modules 12. The power modules 12 may be electrically connected in parallel to multiple DC power busses 304. The fuel cell IT grid system 300 may include M number of DC/DC converters 302. Each power module 12 may be electrically connected to a DC/DC converter 302. The fuel cell IT grid system 300 may include a one-to-one ratio of power modules 12 to DC/DC converters 302. The DC/DC converters 302 may be electrically connected in parallel to the DC power busses 304. Configurations of the fuel cell IT grid system 300 including multiple DC power busses 304 electrically connected to the power modules 12 may increase reliability of electrical power supply from the power modules 12 to the IT loads 310 by providing redundant electrical connections. Each DC/DC converter 302 may be electrically connected between a power module 12 and the DC power busses 304.

The fuel cell IT grid system 300 may include S number of power storage devices 402. Each power storage device 402 may be electrically connected to a power module 12. A power storage device 402 may be electrically connected to a power module 12 via a DC/DC converter 302. The fuel cell IT grid system 300 may include a one-to-many ratio of power modules 12 to power storage devices 402. The power storage devices 402 may be electrically connected to the DC power busses 304 in parallel. In various embodiments, a first power storage device 402 may be electrically connected between a DC/DC converter 302 and a first DC power bus 304, and a second power storage device 402 may be electrically connected between the DC/DC converter 302 and a second DC power bus 304. Configurations of the fuel cell IT grid system 300 including multiple power storage devices 402 electrically connected to associated power modules 12 may increase reliability of electrical power supply from the power storage devices 402 to the IT loads 310 by providing redundant electrical components and connections.

The fuel cell IT grid system 300 may include any number of T of electrical protection components configured to electrically connect and disconnect the DC power busses 304 from the power modules 12 and/or the power storage devices 402. In various embodiments, the electrical protection components may include DC disconnects 400. Each DC disconnect 400 may be configured to connect and disconnect a power module 12 and/or a power storage device 402 from a DC power bus 304. In various embodiments, the DC disconnect 400 may selectively connect and disconnect one of or both the power module 12 and the power storage device 402 electrically connected to the DC disconnect 400. In various embodiments, a first DC disconnect 400 may electrically connect and disconnect a power module 12 and a first power storage device 402 from the first DC power bus 304, and a second DC disconnect 400 may electrically connect and disconnect the power module 12 and a second power storage device 402 from the second DC power bus 304. In various embodiments, a DC disconnect 400 may similarly and additionally connect and disconnect a DC/DC converter 302 from a DC power bus 304.

The fuel cell IT grid system 300 may include Q number of IT loads 310. The IT loads 310 may be electrically connected in parallel to the DC power busses 304. In various embodiments, the electrical connection between an IT load 310 and the DC power busses 304 may be dual corded, which may increase reliability of electrical power supply from the DC power busses 304 to the IT load 310 by providing redundant electrical connections. In various embodiments, an IT load 310 may be electrically connected to the first DC power bus 304 and the second DC power bus 304. The fuel cell IT grid system 300 may include P number of DC/AC inverters 308. Each IT load 310 may be electrically connected to multiple DC/AC inverters 308. The fuel cell IT grid system 300 may include a one-to-many ratio of IT loads 310 to DC/AC inverters 308. The DC/AC inverters 308 may be electrically connected in parallel to the DC power busses 304. In various embodiments, a first DC/AC inverter 308 electrically connected to an IT load 310 may be electrically connected to the first DC power bus 304, and a second DC/AC inverter 308 electrically connected to the IT load 310 may be electrically connected to the second DC power bus 304. Configurations of the fuel cell IT grid system 300 including multiple DC power busses 304 and multiple DC/AC inverters 308 electrically connected to associated IT loads 310 may increase reliability of electrical power supply from the power modules 12 to the IT loads 310 by providing redundant electrical components and connections. Each DC/AC inverter 308 may be electrically connected between an IT load 310 and a DC power bus 304, electrically connecting the IT load 310 to the DC power bus 304.

The fuel cell IT grid system 300 may include P number of transformers 406. Each IT load 310 may be electrically connected to multiple transformers 406. The fuel cell IT grid system 300 may include a one-to-many ratio of IT loads 310 to transformers 406. The transformers 406 may be electrically connected in parallel to the DC power busses 304. In various embodiments, a first transformer 406 electrically connected to an IT load 310 may be electrically connected to the first DC power bus 304, and a second transformer 406 electrically connected to the IT load 310 may be electrically connected to the second DC power bus 304. Each transformer 406 may be electrically connected to the DC power busses 304 via a DC/AC inverter 308. Configurations of the fuel cell IT grid system 300 including multiple transformers 406 electrically connected to associated IT loads 310 may increase reliability of electrical power supply from the power modules 12 to the IT loads 310 by providing redundant electrical components and connections. Each transformer 406 may be electrically connected between an IT load 310 and a DC power bus 304, electrically connecting the IT load 310 to the DC power bus 304. In various embodiments, a fuel cell IT grid system 300 may include a one-to-many ratio of transformers 406 to IT loads 310. In various embodiments, a transformer 406 may be optional. A transformer 406 may be included on a fuel cell IT grid system 300 for mismatches in the native voltages of the power modules 12 and the IT loads 310, and may be excluded for power modules 12 and the IT loads 310 with matching native voltages.

The fuel cell IT grid system 300 may include P number of electrical protection components configured to electrically connect and disconnect the DC power busses 304 from IT loads 310. In various embodiments, the electrical protection components may include DC disconnects 400. Each DC disconnect 400 may be configured to connect and disconnect an IT load 310 from the DC power busses 304. In various embodiments, a first DC disconnect 400 may be configured to connect and disconnect an IT load 310 from the first DC power bus 304, and a second DC disconnect 400 may be configured to connect and disconnect the IT load 310 from the second DC power bus. In various embodiments, the DC disconnect 400 may similarly and additionally connect and disconnect a DC/AC inverter 308, a circuit breaker 404, and/or a transformer 406 from a DC power bus 304.

The fuel cell IT grid system 300 may include P number of electrical protection components configured to electrically connect and disconnect components of a fuel cell IT grid system 300 from the fuel cell IT grid system 300. In various embodiments, the electrical protection components may include circuit breakers 404. In various embodiments, components of a fuel cell IT grid system 300 may include a transformer 406 and/or an IT load 310. Each circuit breaker 404 may be configured to connect and disconnect an IT load 310 from the fuel cell IT grid system 300. In various embodiments, the circuit breaker 404 may similarly and additionally connect and disconnect a transformer 406 from the fuel cell IT grid system 300. In various embodiments, the circuit breaker 404 may connect and disconnect one of multiple inputs of the IT load 310 from the fuel cell IT grid system 300. In various embodiments, the circuit breaker 404 may be electrically connected between an IT load 310 and a DC/AC inverter 308. In various embodiments, the circuit breaker 404 may be electrically connected between a transformer 404 electrically connected to an IT load 310 and a DC/AC inverter 308.

The fuel cell IT grid system 300 may be electrically connected to any number V or combination of load balancing loads 306. The fuel cell IT grid system 300 may be electrically connected to the load balancing loads 306 via the DC power busses 304. The load balancing loads 306 may receive excess electrical power in the fuel cell IT grid system 300, generated by a combination of the power modules 12, beyond the electrical power demand of the IT loads 310. In various embodiments, the fuel cell IT grid system 300 may be electrically connected to a first load balancing load 306 via the first DC power bus 304, and the fuel cell IT grid system 300 may be electrically connected to a second load balancing load 306 via the second DC power bus 304. In various embodiments, the load balancing loads 306 may be electrically connected to and disconnected from the fuel cell IT grid system 300 by electrical protection components.

In various embodiments, the electrical protection components may include DC disconnects 400 configured to electrically connect and disconnect an associated load balancing load 306 from an associated DC power bus 304.

The fuel cell IT grid system 300 may include a control device 301 configured to receive signals from and control connections to the various components of the system to implement methods of various embodiments.

Figure 6:
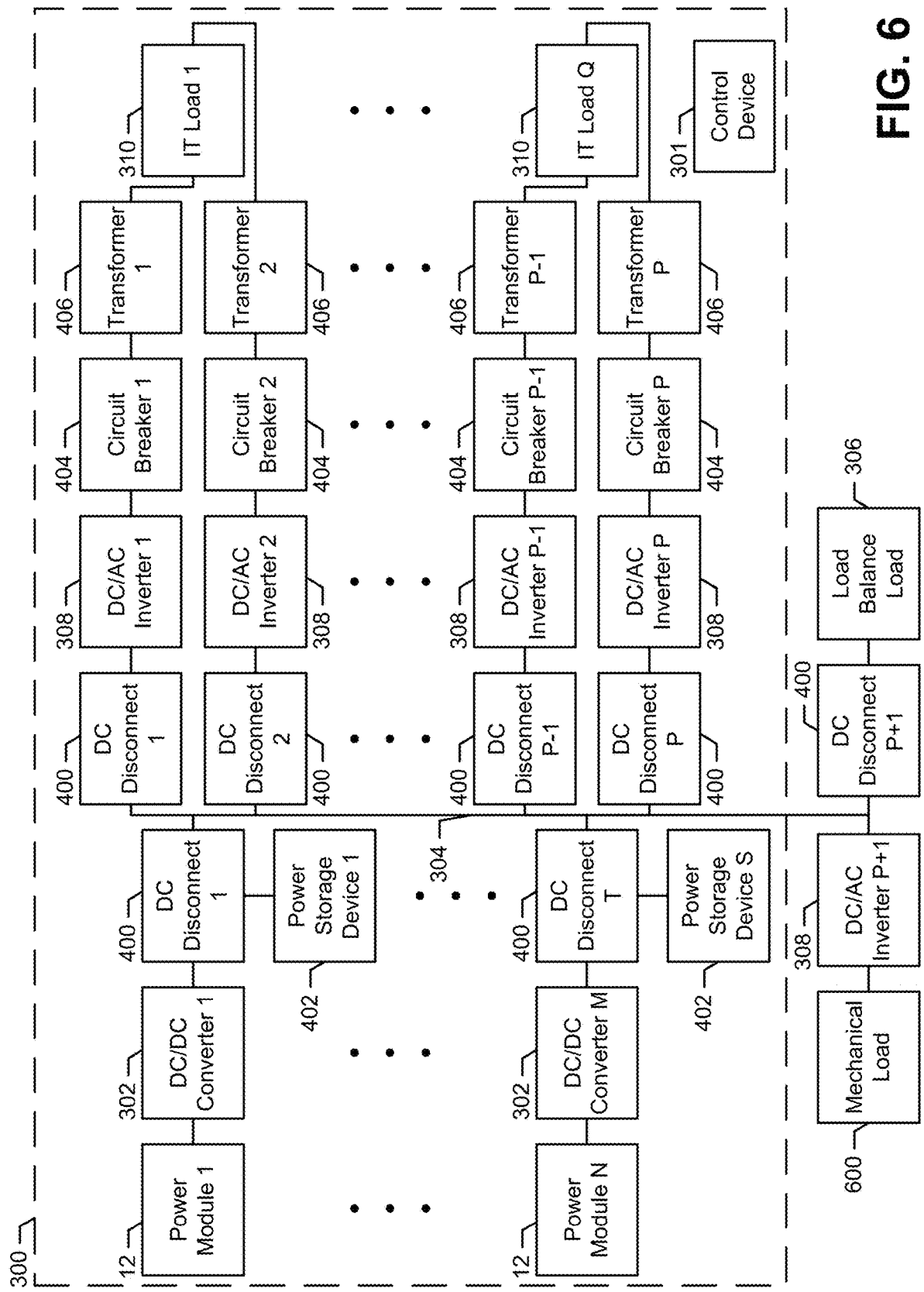
FIG. 6 is a block diagram of a fuel cell IT grid system according to some embodiments.

FIG. 6 illustrates an example of a fuel cell IT grid system 300 electrically connected to varying numbers and combinations of load balancing loads 306, 600. The fuel cell IT grid system 300 may include N number of power modules 12. The power modules 12 may be electrically connected in parallel to a DC power bus 304. The fuel cell IT grid system 300 may include M number of DC/DC converters 302. Each power module 12 may be electrically connected to a DC/DC converter 302. The fuel cell IT grid system 300 may include a one-to-one ratio of power modules 12 to DC/DC converters 302. The DC/DC converters 302 may be electrically connected in parallel to the DC power bus 304. Each DC/DC converter 302 may be electrically connected between a power module 12 and the DC power bus 304.

The fuel cell IT grid system 300 may include S number of power storage devices 402. Each power storage device 402 may be electrically connected to a power module 12. A power storage device 402 may be electrically connected to a power module 12 via a DC/DC converter 302. The power storage devices 402 may be electrically connected to the DC power bus 304 in parallel.

The fuel cell IT grid system 300 may include any number T of electrical protection components configured to electrically connect and disconnect the DC power bus 304 from the power modules 12 and/or the power storage devices 402. In various embodiments, the electrical protection components may include DC disconnects 400. Each DC disconnect 400 may be configured to connect and disconnect a power module 12 and/or a power storage device 402 from the DC power bus 304. In various embodiments, the DC disconnect 400 may selectively connect and disconnect one of or both the power module 12 and the power storage device 402 electrically connected to the DC disconnect 400. In various embodiments, the DC disconnect 400 may similarly and additionally connect and disconnect a DC/DC converter 302 from the DC power bus 304.

The fuel cell IT grid system 300 may include Q number of IT loads 310. The IT loads 310 may be electrically connected in parallel to the DC power bus 304. In various embodiments, the electrical connection between an IT load 310 and the DC power bus 304 may be dual corded, which may increase reliability of electrical power supply from the DC power bus 304 to the IT load 310 by providing redundant electrical connections. The fuel cell IT grid system 300 may include P number of DC/AC inverters 308. Each IT load 310 may be electrically connected to multiple DC/AC inverters 308. The fuel cell IT grid system 300 may include a one-to-many ratio of IT loads 310 to DC/AC inverters 308. The DC/AC inverters 308 may be electrically connected in parallel to the DC power bus 304. In various embodiments, a first DC/AC inverter 308 electrically connected to an IT load 310 may be electrically connected to the DC power bus 304, and a second DC/AC inverter 308 electrically connected to the IT load 310 may be electrically connected to the DC power bus 304. Configurations of the fuel cell IT grid system 300 including multiple DC/AC inverters 308 electrically connected to associated IT loads 310 may increase reliability of electrical power supply from the power modules 12 to the IT loads 310 by providing redundant electrical components and connections. Each DC/AC inverter 308 may be electrically connected between an IT load 310 and a DC power bus 304, electrically connecting the IT load 310 to the DC power bus 304.

The fuel cell IT grid system 300 may include P number of transformers 406. Each IT load 310 may be electrically connected to multiple transformers 406. The fuel cell IT grid system 300 may include a one-to-many ratio of IT loads 310 to transformers 406. The transformers 406 may be electrically connected in parallel to the DC power bus 304. In various embodiments, a first transformer 406 electrically connected to an IT load 310 may be electrically connected to the DC power bus 304, and a second transformer 406 electrically connected to the IT load 310 may be electrically connected to the DC power bus 304. Each transformer 406 may be electrically connected to the DC power bus 304 via a DC/AC inverter 308. Configurations of the fuel cell IT grid system 300 including multiple transformers 406 electrically connected to associated IT loads 310 may increase reliability of electrical power supply from the power modules 12 to the IT loads 310 by providing redundant electrical components and connections. Each transformer 406 may be electrically connected between an IT load 310 and a DC power bus 304, electrically connecting the IT load 310 to the DC power bus 304. In various embodiments, a fuel cell IT grid system 300 may include a one-to-many ratio of transformers 406 to IT loads 310. In various embodiments, a transformer 406 may be optional. A transformer 406 may be included on a fuel cell IT grid system 300 for mismatches in the native voltages of the power modules 12 and the IT loads 310, and may be excluded for power modules 12 and the IT loads 310 with matching native voltages.

The fuel cell IT grid system 300 may include P number of electrical protection components configured to electrically connect and disconnect the DC power bus 304 from IT loads 310. In various embodiments, the electrical protection components may include DC disconnects 400. Each DC disconnect 400 may be configured to connect and disconnect an IT load 310 from the DC power bus 304. In various embodiments, the DC disconnect 400 may similarly and additionally connect and disconnect a DC/AC inverter 308, a circuit breaker 404, and/or a transformer 406 from the DC power bus 304. In various embodiments, the DC disconnect 400 may connect and disconnect one of multiple inputs of the IT load 310 from the DC power bus 304.

The fuel cell IT grid system 300 may include P number of electrical protection components configured to electrically connect and disconnect components of a fuel cell IT grid system 300 from the fuel cell IT grid system 300. In various embodiments, the electrical protection components may include circuit breakers 404. In various embodiments, components of a fuel cell IT grid system 300 may include a transformer 406 and/or an IT load 310. Each circuit breaker 404 may be configured to connect and disconnect an IT load 310 from the fuel cell IT grid system 300. In various embodiments, the circuit breaker 404 may similarly and additionally connect and disconnect a transformer 406 from the fuel cell IT grid system 300. In various embodiments, the circuit breaker 404 may connect and disconnect one of multiple inputs of the IT load 310 from the fuel cell IT grid system 300. In various embodiments, the circuit breaker 404 may be electrically connected between an IT load 310 and a DC/AC inverter 308. In various embodiments, the circuit breaker 404 may be electrically connected between a transformer 404 electrically connected to an IT load 310 and a DC/AC inverter 308.

The fuel cell IT grid system 300 may be electrically connected to any number or combination of load balancing loads 306. In various embodiments, a load balancing load 306 may include a mechanical load 600. The fuel cell IT grid system 300 may be electrically connected to multiple load balancing loads 306 via the DC power bus 304. The load balancing loads 306 may receive excess electrical power in the fuel cell IT grid system 300, generated by a combination of the power modules 12, beyond the electrical power demand of the IT loads 310. In various embodiments, a load balancing load 306 may be electrically connected to and disconnected from the fuel cell IT grid system 300 by electrical protection components. In various embodiments, an electrical protection component may include a DC disconnect 400. In various embodiments, the load balancing load 306 may be any load that requires AC electrical power, such as an AC mechanical load 600. An AC mechanical load 600 may be electrically connected to the DC power bus 304 via a DC/AC inverter 308.

Figure 7:
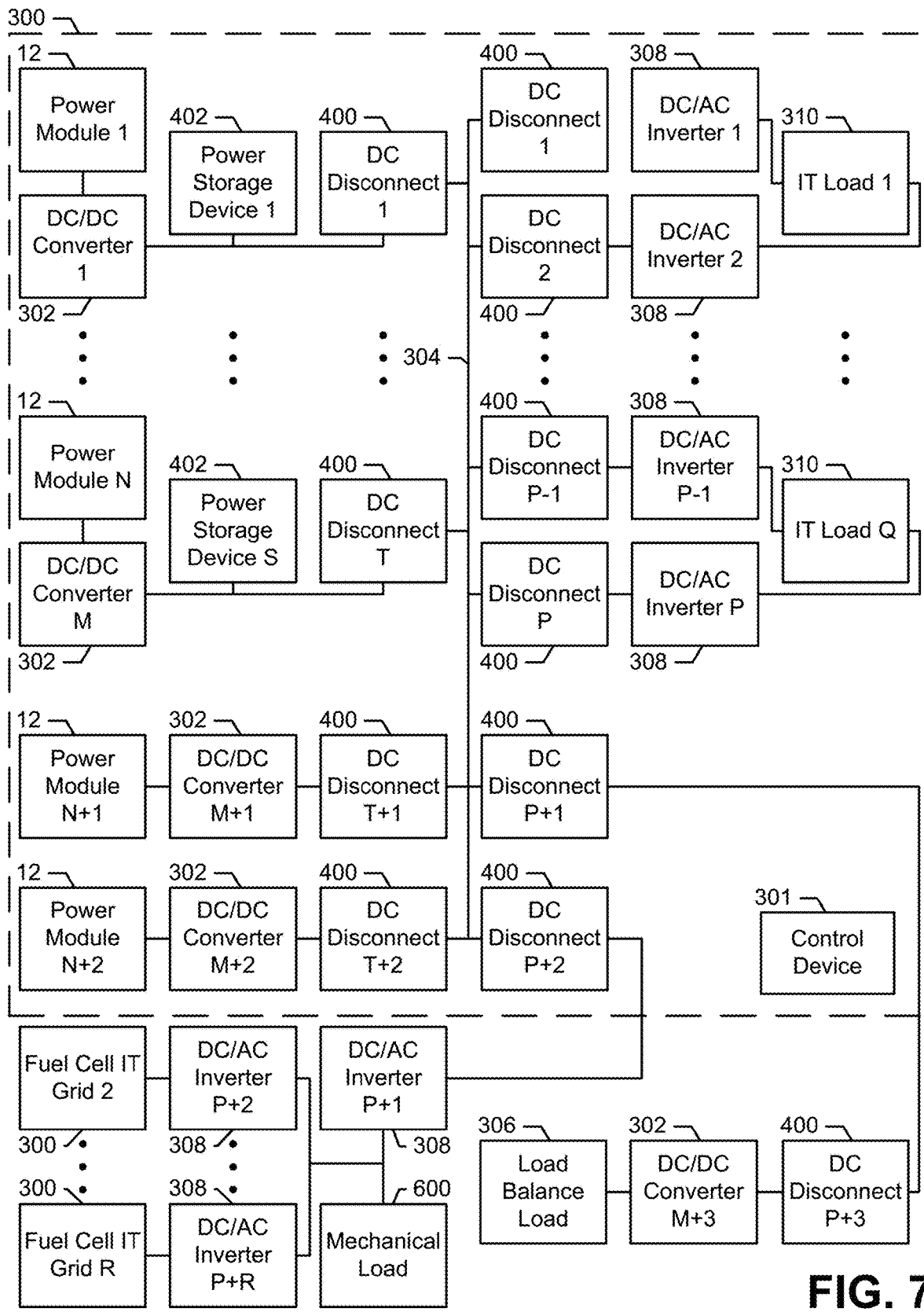
FIG. 7 is a block diagram of a fuel cell IT grid system according to some embodiments.
Figure 8:
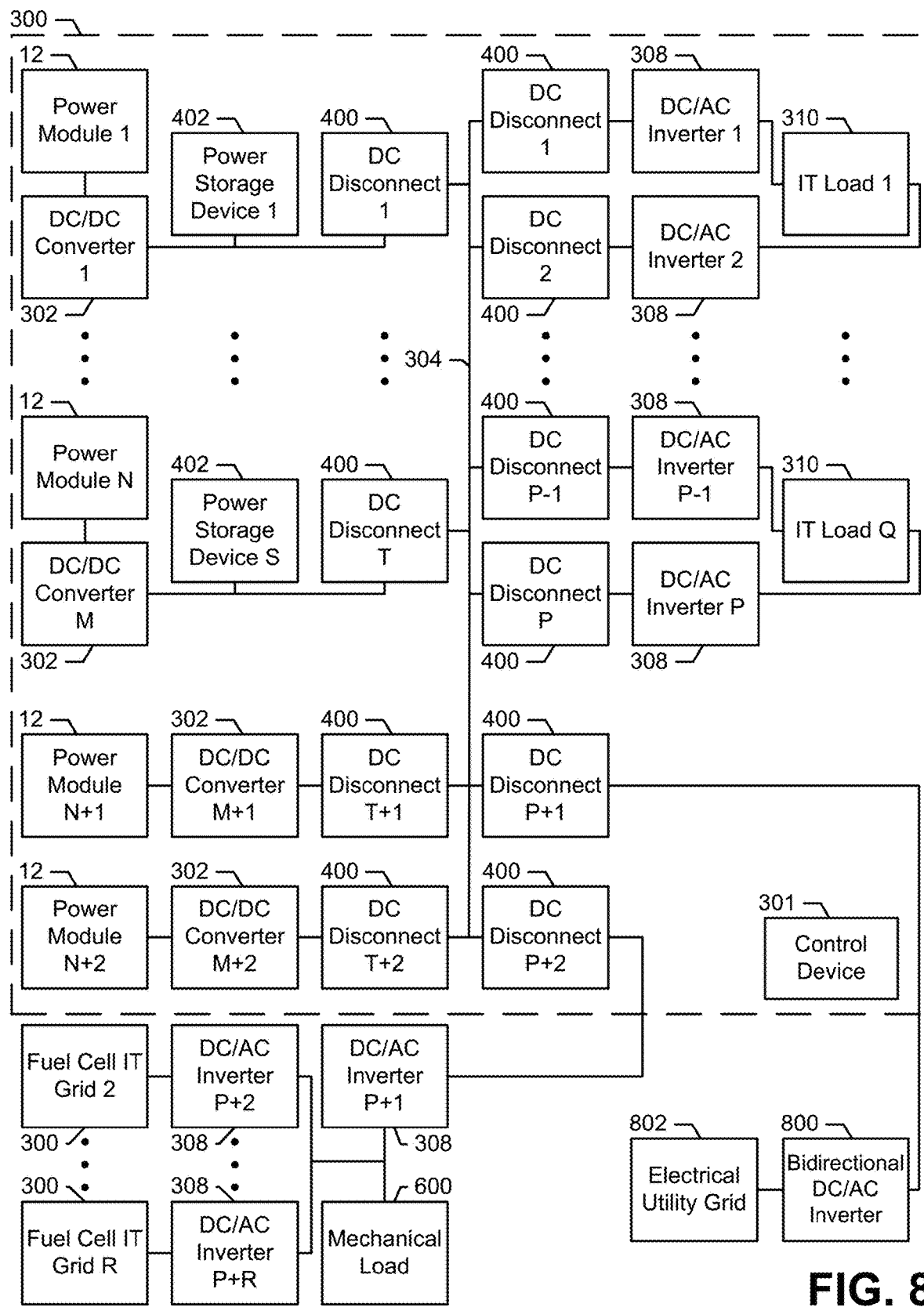
FIG. 8 is a block diagram of a fuel cell IT grid system according to some embodiments.

FIGS. 7 and 8 illustrate examples of a fuel cell IT grid system 300 electrically connected to varying numbers and combinations of load balancing loads 306, 600. The fuel cell IT grid system 300 may include N number of power modules 12. The power modules 12 may be electrically connected in parallel to a DC power bus 304. The fuel cell IT grid system 300 may include M number of DC/DC converters 302. Each power module 12 may be electrically connected to a DC/DC converter 302. The fuel cell IT grid system 300 may include a one-to-one ratio of power modules 12 to DC/DC converters 302. The DC/DC converters 302 may be electrically connected in parallel to the DC power bus 304. Each DC/DC converter 302 may be electrically connected between a power module 12 and the DC power bus 304.

The fuel cell IT grid system 300 may include S number of power storage devices 402. Each power storage device 402 may be electrically connected to a power module 12. A power storage device 402 may be electrically connected to a power module 12 via a DC/DC converter 302. The power storage devices 402 may be electrically connected to the DC power bus 304 in parallel.

The fuel cell IT grid system 300 may include any number T of electrical protection components configured to electrically connect and disconnect the DC power bus 304 from the power modules 12 and/or the power storage devices 402. In various embodiments, the electrical protection components may include DC disconnects 400. Each DC disconnect 400 may be configured to connect and disconnect a power module 12 and/or a power storage device 402 from the DC power bus 304. In various embodiments, the DC disconnect 400 may selectively connect and disconnect one of or both the power module 12 and the power storage device 402 electrically connected to the DC disconnect 400. In various embodiments, the DC disconnect 400 may similarly and additionally connect and disconnect a DC/DC converter 302 from the DC power bus 304.

The fuel cell IT grid system 300 may include Q number of IT loads 310. The IT loads 310 may be electrically connected in parallel to the DC power bus 304. In various embodiments, the electrical connection between an IT load 310 and the DC power bus 304 may be dual corded, which may increase reliability of electrical power supply from the DC power bus 304 to the IT load 310 by providing redundant electrical connections. The fuel cell IT grid system 300 may include P number of DC/AC inverters 308. Each IT load 310 may be electrically connected to multiple DC/AC inverters 308. The fuel cell IT grid system 300 may include a one-to-many ratio of IT loads 310 to DC/AC inverters 308. The DC/AC inverters 308 may be electrically connected in parallel to the DC power bus 304. In various embodiments, a first DC/AC inverter 308 electrically connected to an IT load 310 may be electrically connected to the DC power bus 304, and a second DC/AC inverter 308 electrically connected to the IT load 310 may be electrically connected to the DC power bus 304. Configurations of the fuel cell IT grid system 300 including multiple DC/AC inverters 308 electrically connected to associated IT loads 310 may increase reliability of electrical power supply from the power modules 12 to the IT loads 310 by providing redundant electrical components and connections. Each DC/AC inverter 308 may be electrically connected between an IT load 310 and a DC power bus 304, electrically connecting the IT load 310 to the DC power bus 304.

The fuel cell IT grid system 300 may include P number of electrical protection components configured to electrically connect and disconnect the DC power bus 304 from IT loads 310. In various embodiments, the electrical protection components may include DC disconnects 400. Each DC disconnect 400 may be configured to connect and disconnect an IT load 310 from the DC power bus 304. In various embodiments, the DC disconnect 400 may similarly and additionally connect and disconnect a DC/AC inverter 308 from the DC power bus 304. In various embodiments, the DC disconnect 400 may connect and disconnect one of multiple inputs of the IT load 310 from the DC power bus 304.

In various embodiments, the fuel cell IT grid system 300 may further include any number and combination of additional power modules 12, DC/DC converters 302, and electrical protection components in other configurations. In various embodiments, electrical protection components may include DC disconnects 400. An additional power module 12 may be electrically connected to the DC power bus in parallel with the N number of power modules 12. The additional power module 12 may be configured like the N number of power modules 12. However, the additional power module 12 may be redundant to the N number of power modules 12, and configured to provide electrical power to the IT loads 310 in response to the N number of power modules 12 providing insufficient electrical power to satisfy an electrical power demand of the IT loads 310. In various aspects, the additional power module 12 may normally provide electrical power to the DC power bus 304 in excess of the electrical power demands of the IT loads 310. The additional power module 12 may normally operate to maintain a temperature above its temperature threshold. An additional DC/DC converter may be configured similar to the M number of DC/DC converters 302, and electrically connect the additional power module 12 to the DC power bus. An additional DC disconnect 400 may be configured similar to the M number of DC disconnects 400, to electrically connect and disconnect the additional power module 12 and/or the additional DC/DC converter 302 from the DC power bus. In various embodiments, an additional DC disconnect 400 may be configured to connect and disconnect the DC power bus 304 from any number and combination of load balancing loads 306, 600.

The fuel cell IT grid system 300 may include a control device 301 configured to receive signals from and control connections to the various components of the system to implement methods of various embodiments.

The example illustrated in FIG. 7 demonstrates that the fuel cell IT grid system 300 may be electrically connected to any number or combination of load balancing loads 306. In various embodiments, a load balancing load 306 may include a mechanical load 600. The fuel cell IT grid system 300 may be electrically connected to multiple load balancing loads 306 via the DC power bus 304. The load balancing loads 306 may receive excess electrical power in the fuel cell IT grid system 300, generated by a combination of the power modules 12, beyond the electrical power demand of the IT loads 310. In various embodiments, a DC/DC converter 302 may be electrically connected to a DC load balancing load 306 and configured to convert a DC electrical power received from the fuel cell IT grid system 300 to a DC electrical current consumable by the load balancing load 306. In various embodiments, the load balancing load 306 may be electrically connected to and disconnected from the fuel cell IT grid system 300 by electrical protection components. In various embodiments, an electrical protection component may include a DC disconnect 400. The DC disconnect 400 may be configured to connect and disconnect the load balancing load 306 and/or the DC/DC converter 302 from the DC power bus 304 of the fuel cell IT grid system 300.

In various embodiments, the load balancing load 306 may be any load that requires AC electrical power, such as an AC mechanical load 600. An AC mechanical load 600 may be electrically connected to the DC power bus 304 via a DC/AC inverter 308. The DC/AC inverter 308 may be configured to invert the DC electrical power received from the fuel cell IT grid system 300 to an AC electrical power consumable by the mechanical load 600. In various embodiments, the mechanical load 600 may be electrically connected to R number of fuel cell IT grid systems 300. Each connected fuel cell IT grid system 300 may be electrically connected to the mechanical load 600 via a DC/AC inverter 308.

The fuel cell IT grid system 300 may include a control device 301 configured to receive signals from and control connections to the various components of the system to implement methods of various embodiments.

The example illustrated in FIG. 8 demonstrates that the fuel cell IT grid system 300 may be electrically connected to any number or combination of load balancing loads. In various embodiments, a load balancing load may include a mechanical load 600. In various embodiments, a load balancing load may include an electrical utility grid 802. The fuel cell IT grid system 300 may be electrically connected to multiple load balancing loads via the DC power bus 304. The load balancing loads may receive excess electrical power generated by a combination of the power modules 12 in the fuel cell IT grid system 300 beyond the electrical power demand of the IT loads 310. In various embodiments, the load balancing load may be any load that requires AC electrical power. A load balancing load may be electrically connected to the DC power bus 304 via a DC/AC inverter 308 or a bidirectional DC/AC inverter 800. The DC/AC inverter 308 or the bidirectional DC/AC inverter 800 may be configured to invert the DC electrical power received from the fuel cell IT grid system 300 to an AC electrical power consumable by the load balancing load. In various embodiments, the mechanical load 600 may be electrically connected to R number of fuel cell IT grid systems 300. Each connected fuel cell IT grid system 300 may be electrically connected to the mechanical load 600 via a DC/AC inverter 308.

The electrical utility grid 802 may also provide electrical power to the fuel cell IT grid system 300 in response to electrical power in the fuel cell IT grid system 300 being insufficient to meet the electrical power demands of the IT loads 310 of the fuel cell IT grid system 300. The bidirectional DC/AC inverter may be configured to invert AC electrical power provided by the electrical utility grid 802 to a DC electrical power and provide the DC electrical power to the DC power bus 304 of the fuel cell IT grid system 300. In a fuel cell IT grid system 300, DC electrical power provided to the DC power bus 304 may be directed to the IT loads 310 via a DC/AC inverter 308 to supplement the DC electrical power generated in the fuel cell IT grid system 300 and to meet the electrical power demands of the IT loads.

Figure 9:
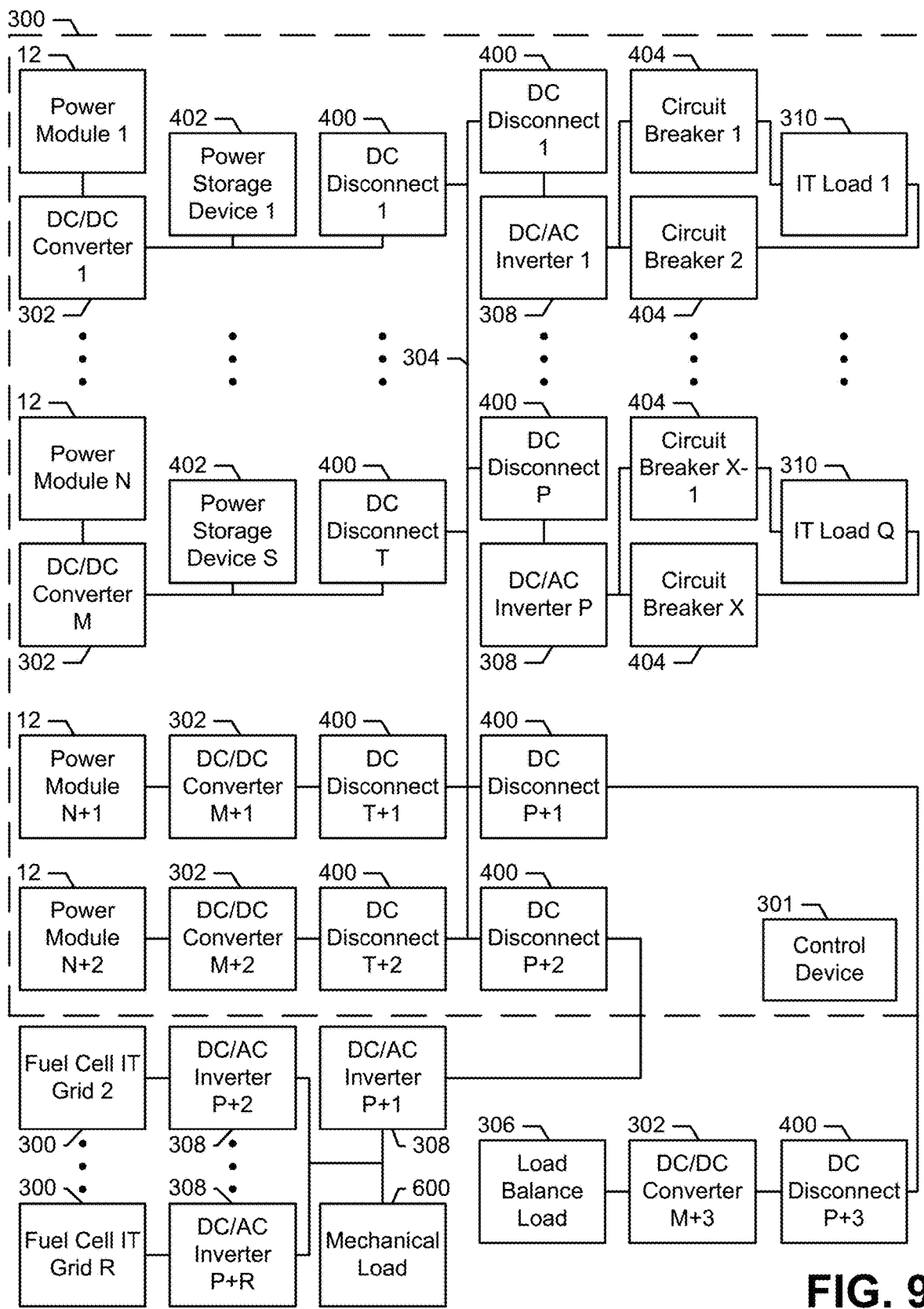
FIG. 9 is a block diagram of a fuel cell IT grid system according to some embodiments.
Figure 10:
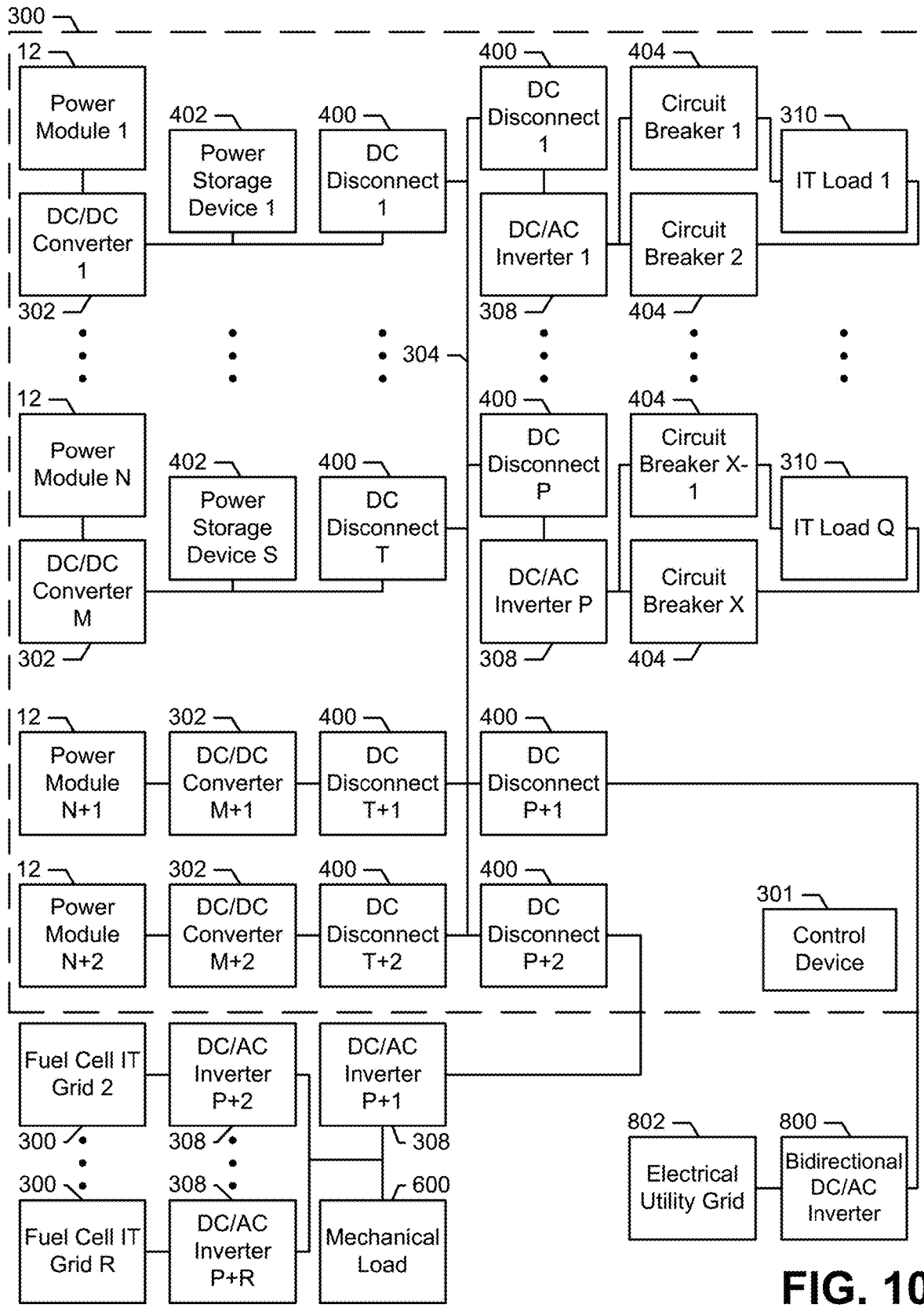
FIG. 10 is a block diagram of a fuel cell IT grid system according to some embodiments.

FIGS. 9 and 10 illustrate examples of a fuel cell IT grid system 300 electrically connected to varying numbers and combinations of load balancing loads 306, 600. The fuel cell IT grid system 300 may include N number of power modules 12. The power modules 12 may be electrically connected in parallel to a DC power bus 304. The fuel cell IT grid system 300 may include M number of DC/DC converters 302. Each power module 12 may be electrically connected to a DC/DC converter 302. The fuel cell IT grid system 300 may include a one-to-one ratio of power modules 12 to DC/DC converters 302. The DC/DC converters 302 may be electrically connected in parallel to the DC power bus 304. Each DC/DC converter 302 may be electrically connected between a power module 12 and the DC power bus 304.

The fuel cell IT grid system 300 may include S number of power storage devices 402. Each power storage device 402 may be electrically connected to a power module 12. A power storage device 402 may be electrically connected to a power module 12 via a DC/DC converter 302. The power storage devices 402 may be electrically connected to the DC power bus 304 in parallel.

The fuel cell IT grid system 300 may include any number T of electrical protection components configured to electrically connect and disconnect the DC power bus 304 from the power modules 12 and/or the power storage devices 402. In various embodiments, the electrical protection components may include DC disconnects 400. Each DC disconnect 400 may be configured to connect and disconnect a power module 12 and/or a power storage device 402 from the DC power bus 304. In various embodiments, the DC disconnect 400 may selectively connect and disconnect one of or both the power module 12 and the power storage device 402 electrically connected to the DC disconnect 400. In various embodiments, the DC disconnect 400 may similarly and additionally connect and disconnect a DC/DC converter 302 from the DC power bus 304.

The fuel cell IT grid system 300 may include Q number of IT loads 310. The IT loads 310 may be electrically connected in parallel to the DC power bus 304. In various embodiments, the electrical connection between an IT load 310 and the DC power bus 304 may be dual corded, which may increase reliability of electrical power supply from the DC power bus 304 to the IT load 310 by providing redundant electrical connections. The fuel cell IT grid system 300 may include P number of DC/AC inverters 308. Each IT load 310 may be electrically connected to a DC/AC inverter 308. The fuel cell IT grid system 300 may include a one-to-one ratio of IT loads 310 to DC/AC inverters 308. The DC/AC inverters 308 may be electrically connected in parallel to the DC power bus 304. Each DC/AC inverter 308 may be electrically connected between an IT load 310 and a DC power bus 304, electrically connecting the IT load 310 to the DC power bus 304.

The fuel cell IT grid system 300 may include P number of electrical protection components configured to electrically connect and disconnect the DC power bus 304 from IT loads 310. In various embodiments, the electrical protection components may include DC disconnects 400. Each DC disconnect 400 may be configured to connect and disconnect an IT load 310 from the DC power bus 304. In various embodiments, the DC disconnect 400 may similarly and additionally connect and disconnect a DC/AC inverter 308 and/or a circuit breaker 404 from the DC power bus 304.

The fuel cell IT grid system 300 may include any number "X" of electrical protection components configured to electrically connect and disconnect IT loads 310 from the fuel cell IT grid system 300. In various embodiments, the electrical protection components may include circuit breakers 404. Each circuit breaker 404 may be configured to connect and disconnect an IT load 310 from the fuel cell IT grid system 300. In various embodiments, the circuit breaker 404 may connect and disconnect one of multiple inputs of the IT load 310 from the fuel cell IT grid system 300. In various embodiments, the circuit breaker 404 may be electrically connected between an IT load 310 and a DC/AC inverter 308.

In various embodiments, the fuel cell IT grid system 300 may further include any number and combination of additional power modules 12, DC/DC converters 302, and electrical protection components in other configurations. In various embodiments, electrical protection components may include DC disconnects 400. An additional power module 12 may be electrically connected to the DC power bus in parallel with the N number of power modules 12. The additional power module 12 may be configured like the N number of power modules 12. However, the additional power module 12 may be redundant to the N number of power modules 12, and configured to provide electrical power to the IT loads 310 in response to the N number of power modules 12 providing insufficient electrical power to satisfy an electrical power demand of the IT loads 310. In various aspects, the additional power module 12 may normally provide electrical power to the DC power bus 304 in excess of the electrical power demands of the IT loads 310. The additional power module 12 may normally operate to maintain a temperature above its temperature threshold. An additional DC/DC converter may be configured similar to the M number of DC/DC converter 302, electrically connecting the additional power module 12 to the DC power bus. An additional DC disconnect 400 may be configured similar to the M number of DC disconnects 400, and electrically connect and disconnect the additional power module 12 and/or the additional DC/DC converter 302 from the DC power bus. In various embodiments, an additional DC disconnect 400 may be configured to connect and disconnect the DC power bus 304 from any number and combination of load balancing loads 306, 600.

The fuel cell IT grid system 300 may include a control device 301 configured to receive signals from and control connections to the various components of the system to implement methods of various embodiments.

The example illustrated in FIG. 9 demonstrates that the fuel cell IT grid system 300 may be electrically connected to any number or combination of load balancing loads 306. In various embodiments, a load balancing load 306 may include a DC mechanical load 600. The fuel cell IT grid system 300 may be electrically connected to multiple load balancing loads 306 via the DC power bus 304. The load balancing loads 306 may receive excess electrical power in the fuel cell IT grid system 300, generated by a combination of the power modules 12, beyond the electrical power demand of the IT loads 310. In various embodiments, a DC/DC converter 302 may be electrically connected to a DC load balancing load 306 and configured to convert a DC electrical power received from the fuel cell IT grid system 300 to a DC electrical current consumable by the load balancing load 306. In various embodiments, the load balancing load 306 may be electrically connected to and disconnected from the fuel cell IT grid system 300 by electrical protection components. In various embodiments, an electrical protection component may include a DC disconnect 400. The DC disconnect 400 may be configured to connect and disconnect the load balancing load 306 and/or the DC/DC converter 302 from the DC power bus 304 of the fuel cell IT grid system 300.

In various embodiments, the load balancing load 306 may be any load that requires AC electrical power, such as an AC mechanical load 600. An AC mechanical load 600 may be electrically connected to the DC power bus 304 via a DC/AC inverter 308. The DC/AC inverter 308 may be configured to invert the DC electrical power received from the fuel cell IT grid system 300 to an AC electrical power consumable by the mechanical load 600. In various embodiments, the mechanical load 600 may be electrically connected to R number of fuel cell IT grid systems 300. Each connected fuel cell IT grid system 300 may be electrically connected to the mechanical load 600 via a DC/AC inverter 308.

The fuel cell IT grid system 300 may include a control device 301 configured to receive signals from and control connections to the various components of the system to implement methods of various embodiments.

The example illustrated in FIG. 10 demonstrates that the fuel cell IT grid system 300 may be electrically connected to any number or combination of load balancing loads. In various embodiments, a load balancing load may include a mechanical load 600. In various embodiments, a load balancing load may include an electrical utility grid 802. The fuel cell IT grid system 300 may be electrically connected to multiple load balancing loads via the DC power bus 304. The load balancing loads may receive excess electrical power generated by a combination of the power modules 12 in the fuel cell IT grid system 300 beyond the electrical power demand of the IT loads 310. In various embodiments, the load balancing load may be any load that requires AC electrical power. A load balancing load may be electrically connected to the DC power bus 304 via a DC/AC inverter 308 or a bidirectional DC/AC inverter 800. The DC/AC inverter 308 or the bidirectional DC/AC inverter 800 may be configured to invert the DC electrical power received from the fuel cell IT grid system 300 to an AC electrical power consumable by the AC load balancing load. In various embodiments, the mechanical load 600 may be electrically connected to R number of fuel cell IT grid systems 300. Each connected fuel cell IT grid system 300 may be electrically connected to the mechanical load 600 via a DC/AC inverter 308.

The electrical utility grid 802 may also provide electrical power to the fuel cell IT grid system 300 in response to electrical power in the fuel cell IT grid system 300 being insufficient to meet the electrical power demands of the IT loads 310 of the fuel cell IT grid system 300. The bidirectional DC/AC inverter may be configured to invert an AC electrical power provided by the electrical utility grid 802 to a DC electrical power and provide the DC electrical power to the DC power bus 304 of the fuel cell IT grid system 300. The DC electrical power provided to the DC power bus 304 may be directed to the IT loads 310, via a DC/AC inverter 308 if the fuel cell IT grid system 300, to supplement the DC electrical power generated in the fuel cell IT grid system 300 and to meet the electrical power demands of the IT loads.

In various embodiments, the fuel cell IT grid system 300 and/or the components of the fuel cell IT grid system 300, examples of which are illustrated in FIGS. 3-10, may include any number and combination of control devices 301 (e.g., programmable processing devices configured to execute computer code) configured to control the functions of any number and combination of the components of the fuel cell IT grid system 300. Similarly, any number and combination of control device(s) 301 *s* may be implemented to control the functions of the load balancing loads 306, including the mechanical load 600 and/or the electrical utility grid 802, and the components electrically connecting the load balancing loads 306 to the fuel cell IT grid system 300. The control device(s) 301 *s* may be configured to monitor the operation and functions of the fuel cell IT grid system 300, the components of the fuel cell IT grid system 300, the load balancing loads 306, and/or the components electrically connecting the load balancing loads 306 to the fuel cell IT grid system 300. The control device(s) 301 *s* may be communicatively connected and configured to send signals between the control device(s) 301 *s* relating to the operation and functions of the fuel cell IT grid system 300, the components of the fuel cell IT grid system 300, the load balancing loads 306, and/or the components electrically connecting the load balancing loads 306 to the fuel cell IT grid system 300. The control device(s) 301 *s* may be configured to interpret signals received from another control device(s) 301. In various embodiments, controlling the functions, monitoring the operation and functions, sending signals relating to the operation and functions, and interpreting received signals may relate to maintaining a temperature of a power module 12 above a temperature threshold, determining and responding to an electrical power demand of an IT load 310, and directing excess electrical power from the fuel cell IT grid system 300 to a load balancing load 360, 600, 802.

The fuel cell IT grid system 300 may include a control device 301 configured to receive signals from and control connections to the various components of the system to implement methods of various embodiments.

Figure 11:
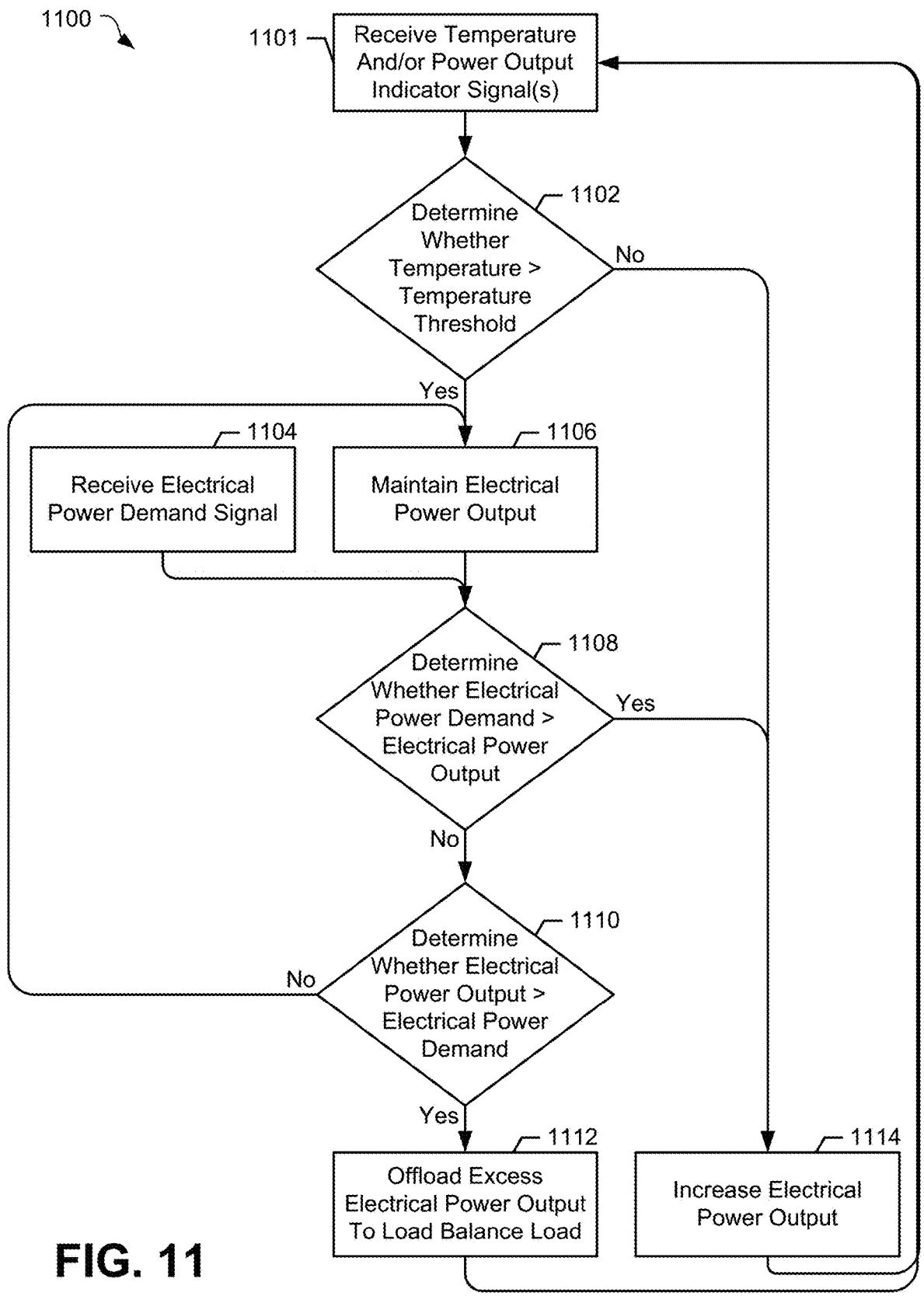
FIG. 11 is a process flow diagram for managing a fuel cell IT grid system according to some embodiments.

FIG. 11 illustrates a method 1100 for managing a fuel cell IT grid system 300 according to various embodiments. The method 1100 may be implemented using one or more control devices 301 configured to receive signals from and/or send control signals to any number or combination of power modules 12, DC/DC converters 302, DC power busses 304, load balancing loads 306, including mechanical loads 600 and/or electrical grids 802, DC/AC inverters 308, IT loads 310, electrical protection components, including DC disconnects 400 and/or circuit breakers 404, power storage devices 402, transformers 406, and/or bidirectional DC/AC inverters 800. In order to encompass the alternative configurations enabled in various embodiments, the hardware implementing the method 1100 is referred to herein as a "control device."

In block 1101, a control device may receive, from a sensor in the power module 12 and/or a control device of the power module 12, a signal indicative of the temperature and/or the power output of a power module 12.

In determination block 1102, a control device may determine whether a temperature of the power module 12 exceeds a temperature threshold for the power module 12. As described above, the temperature threshold may be a temperature at which heating the power module 12 to a temperature above the temperature threshold from a temperature below the temperature threshold may fatigue or damage components of the power module 12.

In some embodiments, the control device may compare a temperature of the power module 12 based upon temperature indication signals obtained in block 1101 to the temperature threshold of the power module 12 in determination block 1102.

The temperature of the power module 12 may be correlated with an electrical power output of the power module 12. Thus, in some embodiments, electrical output of the power module 12 obtained in block 1101 may be used to determine and control the temperature of the power module. To determine whether the temperature of the power module 12 exceeds the temperature of the power module 12 in determination block 1102, the control device may determine whether the electrical output of the power module 12 exceeds an electrical power output threshold of the power module 12. The control device may compare the electrical output of the power module 12 received in block 1101 to the electrical power output threshold of the power module 12. In some embodiments, the control device may convert the electrical power output of the power module 12 into temperature units, and compare the calculated temperature of the power module 12 to the temperature threshold for the power module 12.

In response to determining that the temperature of the power module 12 exceeds the temperature threshold for the power module 12 (i.e., determination block 1102="Yes"), the control device may maintain the electrical power output of the power module 12 in block 1106. As noted herein, the temperature of the power module 12 may correlate with the electrical power output of the power module 12. Therefore, maintaining the electrical power output of the power module 12 may serve to maintain the temperature of the power module 12 above the temperature threshold.

In various embodiments, at any point during execution of the method 1100, the control device may receive an electrical power demand signal in block 1104. In various embodiments, the electrical power demand signal may be or may indicate a change in the electrical power demand of the IT loads 310 in the fuel cell IT grid system 300. In various embodiments, the control device may continuously receive an electrical power demand signal, and may determine when there is a change in the continuously received electrical power demand signal. In block 1104, receiving the electrical power demand signal may include receiving a change in a continuously received electrical power demand signal.

In response to receiving an electrical power demand signal in block 1104, or following maintaining the electrical power output of the power module 12 in block 1106, the control device may determine whether the electrical power demand of the IT loads 310 exceeds the electrical power output of the power modules 12 in the fuel cell IT grid system 300 in determination block 1108. The control device may determine the electrical output from a sensor at the DC power bus 304, from sensors at outputs of the power modules 12 or any component of the fuel cell IT grid system 300 electrically connecting the power modules 12 to the IT loads 310, and/or control devices of the power modules 12 or any component of the fuel cell IT grid system 300 electrically connecting the power modules 12 to the IT loads 310. In various embodiments, the control device may combine electrical outputs from the power modules 12 or the various components of the fuel cell IT grid system 300 to determine the electrical output of the power modules 12 in the fuel cell IT grid system 300. To determine whether the electrical power demand of the IT loads 310 exceeds the electrical power output of the power modules 12 in the fuel cell IT grid system 300, the control device may compare the electrical power demand and the electrical power output.

In response to determining that the electrical power demand does not exceed the electrical power output of the power modules 12 in the fuel cell IT grid system 300 (i.e., determination block 1108="No"), the control device may determine whether the electrical power output of the power modules 12 in the fuel cell IT grid system 300 exceeds the electrical power demand of the IT loads 310 in determination block 1110. The control device may determine whether the electrical power output of the power modules 12 in the fuel cell IT grid system 300 exceeds the electrical power demand of the IT loads 310 in a similar manner as determining whether the electrical power demand of the IT loads 310 exceeds the electrical power output of the power modules 12 in the fuel cell IT grid system 300 in determination block 1108.

In response to determining that the electrical power output of the power modules 12 in the fuel cell IT grid system 300 exceeds the electrical power demand of the IT loads 310 (i.e., determination block 1110="Yes"), the control device may direct excess electrical power output of the power modules 12 in the fuel cell IT grid system 300 to any number and combination of load balancing loads 306 in block 1112. In various embodiments, the control device may control the flow of the excess electrical power output to a load balancing load 306 by controlling electrical connections to the load balancing load 306. The control device may control the electrical connections to the load balancing load 306 by directly controlling the electrical connections, by sending control signals to a control device of an electrical connection in the fuel cell IT grid system 300, and/or signaling to a control device of a load balancing load 306 configured to control an electrical connecting of the load balancing load 306 to the DC power bus 304. In various embodiments, the electrical connections to the load balancing load 306 may include a DC/DC converter 302, a DC/AC inverter 308, a DC disconnect 400, a bidirectional DC/AC inverter 800, and/or a switching mechanism configured to electrically connect and disconnect the load balancing load 306 to the DC power bus 304. The control device may be configured to determine an amount of excess electrical power output of the power modules 12. For example, the control device may be configured to determine a difference between the electrical power output of the power modules 12 and the electrical power demand of the IT loads 310.

In response to determining that the electrical power output of the power modules 12 in the fuel cell IT grid system 300 does not exceed the electrical power demand of the IT loads 310 (i.e., determination block 1108="No"), the control device may maintain the electrical power output of the power module 12 in block 1106.

In response to determining that the temperature of the power module 12 does not exceed the temperature threshold for the power module 12 (i.e., determination block 1102="No"), or in response to determining that the electrical power demand does exceed the electrical power output of the power modules 12 in the fuel cell IT grid system 300 (i.e., determination block 1108="Yes"), the control device may increase the electrical power output in the fuel cell IT grid system 300 in block 1114. In various embodiments, the control device may increase the electrical power output in the fuel cell IT grid system 300 by increasing the electrical power output of the power modules 12 and/or power storage devices 402. In various embodiments, the control device may increase the electrical power output in the fuel cell IT grid system 300 by controlling a bidirectional DC/AC inverter 800 to supply electrical power from an electrical utility grid 802. In various embodiments, the control device may control the electrical power output of the power modules 12 and/or power storage devices 402 by directly controlling the power modules 12, the power storage devices 402, and/or electrical connections of the power modules 12 and/or power storage devices 402 to the DC power bus 304. In various embodiments, the control device 301 may control the electrical power output of the power modules 12 and/or power storage devices 402 by sending control signals to a controller of a power module 12, a power storage device 402, and/or an electrical connection of the power module 12 and/or power storage device 402 to the DC power bus 304. In various embodiments, the control device may control the electrical power output in the fuel cell IT grid system 300 by sending control signals to a controller of an electrical connection of the electrical utility grid 802 to the DC power bus 304. In various embodiments, an electrical connection may include a DC/DC converter 302, a DC/AC inverter 308, a DC disconnect 400, a bidirectional DC/AC inverter 800, and/or a switching mechanism configured to electrically connect and disconnect a power module 12, a power storage device 402, and/or a load balancing load 306 to the DC power bus 304.

In various embodiments, the method 1100 may continuously execute. In various embodiments, the method 1100 may continuously execute as a loop either continuously or periodically. In various embodiments, various blocks 1102-1114 may be executed at anytime in parallel with other blocks 1102-1114.

The foregoing method descriptions and diagrams are provided merely as illustrative examples and are not intended to require or imply that the steps of the various embodiments must be performed in the order presented. As will be appreciated by one of skill in the art the order of steps in the foregoing embodiments may be performed in any order. Further, words such as "thereafter," "then," "next," etc. are not intended to limit the order of the steps; these words are simply used to guide the reader through the description of the methods.

One or more diagrams have been used to describe exemplary embodiments. The use of diagrams is not meant to be limiting with respect to the order of operations performed. The foregoing description of exemplary embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

Control elements, including the control device 301 as well as connected controllers described herein, may be implemented using computing devices (such as computer) that include programmable processors, memory and other components that have been programmed with instructions to perform specific functions or may be implemented in processors designed to perform the specified functions. A processor may be any programmable microprocessor, microcomputer or multiple processor chip or chips that can be configured by software instructions (applications) to perform a variety of functions, including the functions of the various embodiments described herein. In some computing devices, multiple processors may be provided. Typically, software applications may be stored in the internal memory before they are accessed and loaded into the processor. In some computing devices, the processor may include internal memory sufficient to store the application software instructions.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The hardware used to implement the various illustrative logics, logical blocks, modules, and circuits described in connection with the aspects disclosed herein may be implemented or performed with a control device that may be or include a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some blocks or methods may be performed by circuitry that is specific to a given function.

The preceding description of the disclosed embodiments is provided to enable any person skilled in the art to make or use any of the described embodiments. Various modifications to these embodiments will be readily apparent to those skilled in the art, and the generic principles defined herein may be applied to other embodiments without departing from the scope of the disclosure. Thus, the claims are not intended to be limited to the embodiments shown herein but are to be accorded the widest scope consistent with the claim language and the principles and novel features disclosed herein.

What is claimed is:

1. A system, comprising:
    a plurality of power modules each including at least one fuel cell;
    a plurality of direct current (DC)/DC converters each electrically connected to a power module of the plurality of power modules;
    a DC power bus electrically connected to the plurality of DC/DC converters in parallel;
    a plurality of information technology (IT) loads electrically connected to the DC power bus in parallel;
    a load balancing load electrically connected to the DC power bus; and
    a control device communicatively connected to a first power module of the plurality of power modules and configured with control device executable instructions to:
        determine whether a temperature of the first power module exceeds a temperature threshold of the first power module;
        determine whether an electrical power output of the plurality of power modules exceeds an electrical power demand of the plurality of IT loads in response to determining that the temperature of the first power module exceeds the temperature threshold of the first power module; and
        direct excess electrical power output to the load balancing load in response to determining that the electrical power output of the plurality of power modules exceeds the electrical power demand of the plurality of IT loads;
    a plurality of DC/alternating current (AC) inverters electrically connected to the DC power bus in parallel and each electrically connected to an IT load of the plurality of IT loads; and
    a dual corded electrical connection between a first DC/AC inverter of the plurality of DC/AC inverters and a first IT load of the plurality of IT loads.

2. The system of claim 1, further comprising:
    a first IT load of the plurality of IT loads; and
    a first DC/AC inverter and a second DC/AC inverter of the plurality of DC/AC inverters, wherein the first DC/AC inverter is electrically connected to a first input of the first IT load and the second DC/DC converter is electrically connected to a second input of the first IT load.

3. The system of claim 2, wherein the DC power bus comprises a first DC power bus and a second DC power bus, and the first DC power bus is electrically connected to the first DC/AC inverter and the second DC power bus is electrically connected to the second DC/AC inverter.

4. The system of claim 1, further comprising a plurality of fuel cell IT grid systems, wherein:
    a first fuel cell IT grid system comprises a first plurality of power modules of the plurality of power modules, a first plurality of DC/DC converters of the plurality of plurality of DC/DC converters, a first DC power bus, a first plurality of DC/AC inverters of the plurality of DC/AC inverters, and a first plurality of IT loads of the plurality of IT loads;
    a second fuel cell IT grid system comprises a second plurality of power modules of the plurality of power modules, a second plurality of DC/DC converters of the plurality of plurality of DC/DC converters, a second DC power bus, a second plurality of DC/AC inverters of the plurality of DC/AC inverters, and a second plurality of IT loads of the plurality of IT loads; and
    the DC power bus electrically connects the first fuel cell IT grid system and the second fuel cell IT grid system to the load balancing load.

* * * * *